United States Patent
Huang et al.

(10) Patent No.: US 12,396,272 B2
(45) Date of Patent: Aug. 19, 2025

(54) STILTED PAD STRUCTURE

(71) Applicant: Taiwan Semiconductor Manufacturing Co., Ltd., Hsinchu (TW)

(72) Inventors: Sin-Yao Huang, Tainan (TW); Hung-Ling Shih, Tainan (TW); Kuo-Ming Wu, Zhubei (TW); Hung-Wen Hsu, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 833 days.

(21) Appl. No.: 17/233,787

(22) Filed: Apr. 19, 2021

(65) Prior Publication Data

US 2022/0231067 A1 Jul. 21, 2022

Related U.S. Application Data

(60) Provisional application No. 63/138,566, filed on Jan. 18, 2021.

(51) Int. Cl.
*H01L 23/522* (2006.01)
*H10F 39/00* (2025.01)
*H10F 39/12* (2025.01)

(52) U.S. Cl.
CPC ......... *H10F 39/026* (2025.01); *H10F 39/199* (2025.01); *H10F 39/809* (2025.01); *H10F 39/811* (2025.01)

(58) Field of Classification Search
CPC ......... H01L 27/14632; H01L 27/14634; H01L 27/14636; H01L 27/1464; H01L 27/14687; H01L 27/1463; H01L 27/14683; H01L 27/146–14893; H01L 2224/08145; H01L 2224/05; H01L 2224/05558; H01L 2224/48463; H01L 2224/04042; H01L 23/5384; H01L 23/5226; H01L 23/5386; H01L 23/49827; H01L 23/481; H01L 23/535; H01L 24/04; H01L 24/42; H01L 25/167; H01L 2225/06541–06544;
(Continued)

(56) References Cited

U.S. PATENT DOCUMENTS 10,734,429 B2 8/2020 Cheng et al.
2009/0130840 A1 5/2009 Wang et al.
(Continued)

*Primary Examiner* — David Vu
(74) *Attorney, Agent, or Firm* — Eschweiler & Potashnik, LLC

(57) ABSTRACT

Various embodiments of the present disclosure are directed towards an integrated circuit (IC) chip comprising a stilted pad structure. A wire underlies a semiconductor substrate on a frontside of the semiconductor substrate. Further, a trench isolation structure extends into the frontside of the semiconductor substrate. The stilted pad structure is inset into a backside of the semiconductor substrate that is opposite the frontside. The stilted pad structure comprises a pad body and a pad protrusion. The pad protrusion underlies the pad body and protrudes from the pad body, through a portion of the semiconductor substrate and the trench isolation structure, towards the wire. The pad body overlies the portion of the semiconductor substrate and is separated from the trench isolation structure by the portion of the semiconductor substrate.

20 Claims, 34 Drawing Sheets

(58) Field of Classification Search
CPC .................................. H01L 2225/06548; H01L 2225/06506–06551; H01L 2225/1041–107; H01L 21/02019; H01L 21/30604–30621; H01L 21/3063–30635; H01L 21/3065–30655; H01L 21/31055–31056; H01L 21/31111–31122; H01L 21/31133–31138; H01L 21/32133–32139; H01L 21/465; H01L 21/31116; H01L 21/67069; H01L 21/32136–32137; H01L 21/02071; H01L 21/0273–0279; H01L 21/312–3128; H01L 21/0276; H01L 2224/08165; H01L 2224/16165; H01L 2224/16235; H01L 2224/32165; H01L 2224/32235; H01L 2224/40165; H01L 2224/40235; H01L 21/76898; H01L 21/76877–76883; H01L 21/7684; H01L 21/76841–76876; H01L 21/76831; H01L 21/76802–76817; H01L 21/76838–76895; H01L 21/76801–76837; H01L 21/76224–76237; H01L 21/823481; H01L 21/823878; G03F 7/004–115; G03F 7/12; G03F 7/16–18; G03F 7/70–70991; G03F 7/26–428; G03F 7/42–428; G03F 9/00–7096; H01J 37/3174–3177; H10F 39/026; H10F 39/199; H10F 39/809; H10F 39/811; H10F 39/807; H10F 39/011

See application file for complete search history.

(56) References Cited

U.S. PATENT DOCUMENTS

| | | |
|---|---|---|
| 2009/0309232 A1* | 12/2009 | Roy ...................... H01L 23/481 257/734 |
| 2012/0001286 A1 | 1/2012 | Yoon |
| 2013/0134542 A1* | 5/2013 | Lu ..................... H01L 27/14636 257/E31.127 |
| 2017/0047301 A1 | 2/2017 | Yang et al. |
| 2017/0141146 A1 | 5/2017 | Belsher et al. |
| 2017/0301715 A1* | 10/2017 | Cheng .............. H01L 27/14632 |
| 2018/0061710 A1* | 3/2018 | Oshige ................... H01L 24/13 |
| 2019/0252333 A1 | 8/2019 | Borthakur et al. |
| 2020/0075458 A1* | 3/2020 | Lee ..................... H01L 23/5226 |
| 2020/0235144 A1* | 7/2020 | Han ................. H01L 27/14621 |
| 2021/0043593 A1* | 2/2021 | Huang ............... H01L 27/1464 |

* cited by examiner

STILTED PAD STRUCTURE

REFERENCE TO RELATED APPLICATION

This application claims the benefit of U.S. Provisional Application No. 63/138,566, filed on Jan. 18, 2021, the contents of which are hereby incorporated by reference in their entirety.

BACKGROUND

Many modern-day electronic devices include complementary metal-oxide-semiconductor (CMOS) image sensors that convert optical images to digital data representing the optical images. One type of CMOS image sensor commonly used in electronic devices is a backside illuminated (BSI) image sensor. A BSI image sensor comprises an array of photodetectors overlying an interconnect structure and configured to receive radiation on an opposite side as the interconnect structure. This arrangement allows radiation to impinge on the photodetectors unobstructed by conductive features in the interconnect structure, such that the BSI image sensor has high sensitivity to incident radiation.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
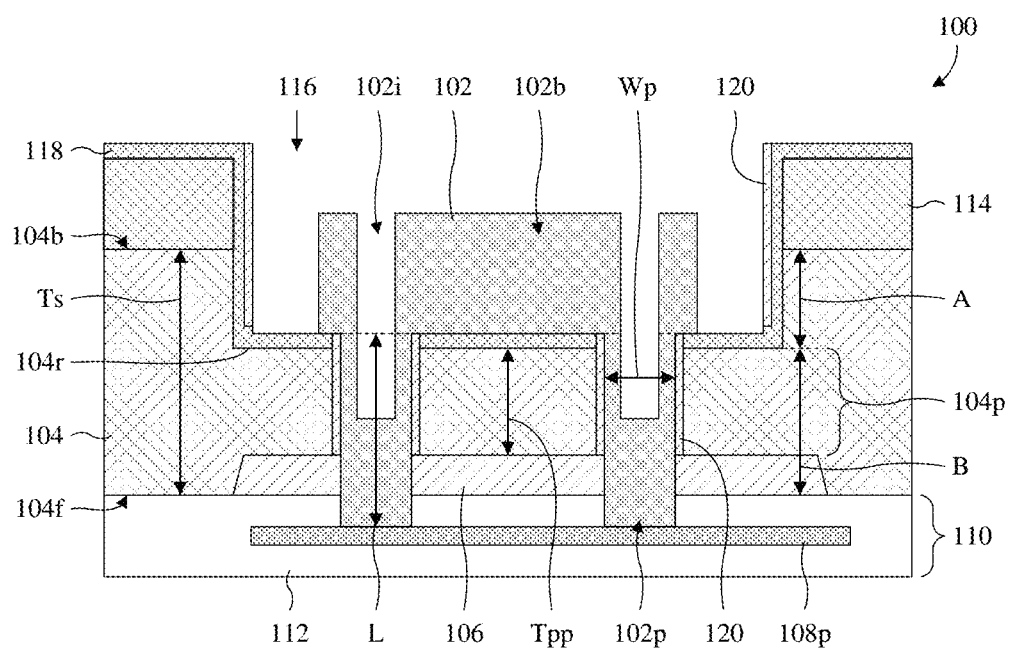
FIG. 1 provides a cross-sectional view of some embodiments of an integrated circuit (IC) chip comprising a stilted pad structure.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An integrated circuit (IC) chip may comprise a pad structure inset into a backside of a semiconductor substrate. Such an IC chip may, for example, correspond to a backside illuminated (BSI) image sensor. According to a method for forming the IC chip, a trench isolation structure is formed extending into a frontside of the semiconductor substrate. Further, an interconnect structure is formed covering the trench isolation structure on the frontside. A first etch is performed selectively into the semiconductor substrate from the backside to form a first opening exposing the trench isolation structure. A second etch is performed selectively from the backside to form a second opening. The second opening has a lesser width than the first opening and extends from the first opening, through the trench isolation, to a wire in the interconnect structure. The pad structure is formed in the first and second openings. The pad structure comprises a pad region in the first opening and further comprises a pad protrusion protruding from the pad region, through the second opening, to the wire.

A challenge with the method is that the pad structure has poor bondability and is hence subject to delamination. Bondability may, for example, be poor because of a small bond area between the pad protrusion and surrounding structure. Another challenge with the method is that the pad structure is large and is inset deep into the backside of the semiconductor substrate, such that backside topography has a high degree of variation. The high degree of variation decreases the process window (e.g., resiliency) for forming other structures on the backside. For example, a metal grid and color filters may be formed on the backside when the IC chip corresponds to a BSI image sensor. To alleviate this challenge, a dielectric filler layer may be formed filling unfilled portions of the first opening and a third etch may be performed selectively into the dielectric filler layer to form a third open exposing the pad structure. However, this adds processing steps and increases costs. Further, these processing steps vary depending on a thickness of the semiconductor substrate and are hence subject to costly and timely tuning of parameters for variations in the thickness.

Various embodiments of the present disclosure are directed towards a stilted pad structure, as well as a method for forming the stilted pad structure. According to some embodiments of the method, a first etch is performed selectively into a backside of a semiconductor substrate to form a first opening. The first opening overlies and is spaced from a trench isolation structure, which extends into a frontside of the semiconductor substrate. A second etch is performed selectively from the backside to form a second opening. The second opening extends from the first opening, through a portion of the semiconductor substrate, to the trench isolation structure. Further, the second opening has a lesser width than the first opening and exposes a sidewall of the semiconductor substrate. A backside spacer layer is deposited on the sidewall, and a third etch is performed blanketing the backside. The third etch forms backside spacers from the backside spacer layer and extends the second opening to a wire underlying the semiconductor substrate on the frontside. The stilted pad structure is formed in the first and second openings. The stilted pad structure comprises a pad region in the first opening and further comprises a pad protrusion protruding from the pad region, through the second opening, to the wire.

Because the first opening is spaced from the trench isolation structure, a length of the protrusion in large and hence the bond area between the protrusion and surrounding structure is large. The large bond area may, in turn, increase bondability of the stilted pad structure and reduce the likelihood of delamination. Because a thickness of the semiconductor substrate is traversed by a combination of the first and second etches, the first etch may extend into backside of the semiconductor substrate to a depth independent of the thickness. As a result, the first etch is not subject to costly and timely tuning of parameters for variations in the thickness. Further, a depth to which the stilted pad structure is inset into the backside of the semiconductor substrate may be small and backside topography may have a small degree of variation. Because of the small degree of variation, the process window (e.g., resiliency) for forming other structures on the backside is large and a dielectric filler layer may be omitted from unfilled portions of the first opening. Further, to the extent that a dielectric filler layer is formed in unfilled portions of the first opening, the corresponding processing steps do not vary depending on the thickness of the semiconductor substrate and are hence not subject to costly and timely tuning of parameters for variations in the thickness.

With reference to FIG. 1, a cross-sectional view 100 of some embodiments of an integrated circuit (IC) chip comprising a stilted pad structure 102 is provided. The stilted pad structure 102 is inset into a backside 104b of a semiconductor substrate 104 and overlies a frontside trench isolation structure 106. The frontside trench isolation structure 106 extends into a frontside 104f of the semiconductor substrate 104 that is opposite the backside. The stilted pad structure 102 comprises a pad body 102b and a pair of pad protrusions 102p.

The pad body 102b is exposed from the backside 104b of the semiconductor substrate 104 and overlies a pad portion 104p of the semiconductor substrate 104. Further, the pad body 102b is separated from sidewalls of surrounding structure and has a top that is flat, except for indents 102i respectively overlying the pad protrusions 102p. In alternative embodiments, the indents 102i are omitted from the top of the pad body 102b.

The pad protrusions 102p are respectively on opposite sides of the pad body 102b and extend from a bottom of the pad body 102b to a pad wire 108p. The pad wire 108p is part of a frontside interconnect structure 110 on the frontside 104f of the semiconductor substrate 104 and is embedded in a frontside interconnect dielectric layer 112. By extending to the pad wire 108p, the pad protrusions 102p electrically couples the pad body 102b to the pad wire 108p. Further, the pad protrusions 102p bond with the frontside interconnect dielectric layer 112, the frontside trench isolation structure 106, and the pad portion 104p of the semiconductor substrate 104 to secure the stilted pad structure 102 in place.

Because the pad body 102b is separated from the frontside trench isolation structure 106 by the pad portion 104p of the semiconductor substrate 104, positioning of the pad body 102b may be independent of variations in a thickness Ts of the semiconductor substrate 104. Instead of varying the positioning of the pad body 102b for variations in the thickness Ts, a thickness Tpp of the pad portion 104p may instead be varied.

Because the positioning of the pad body 102b is independent of variations in the thickness Ts of the semiconductor substrate 104, the pad body 102b may be arranged close to the backside 104b of the semiconductor substrate 104 regardless of the thickness Ts of the semiconductor substrate 104. As a result, topography on the backside 104b of the semiconductor substrate 104 may have a small degree of variation at the stilted pad structure 102. Because of the small degree of variation, the process window (e.g., resiliency) for forming other structures on the backside 104b of the semiconductor substrate 104 may be large. Further, a dielectric filler layer leveling the backside 104b may be omitted, thereby reducing manufacturing costs and increasing manufacturing throughput.

Also, because the pad body 102b is separated from the frontside trench isolation structure 106 by the pad portion 104p of the semiconductor substrate 104, a length L of the pad protrusions 102p may be large (e.g., relative to a pad structure in which the pad portion 104p is omitted). As a result, the bond area between the pad protrusions 102p and surrounding structure may be large. The large bond area may, in turn, increase bondability of the stilted pad structure 102 and reduce the likelihood of delamination. Also, because the length L is large, the pad protrusions 102p are reminiscent of stilts, whereby the pad protrusions 102p may also be referred to as stilts and the stilted pad structure 102 is said to be stilted.

With continued reference to FIG. 1, the semiconductor substrate 104 has a recessed surface 104r extending laterally along a bottom of the pad body 102b from a first side of the stilted pad structure 102 to a second side of the stilted pad structure 102 that is opposite the first side. Further, the pad protrusions 102p extend through the recessed surface 104r. The recessed surface 104r is recessed relative to a top surface of the semiconductor substrate 104 by a separation A, and is elevated relative to a bottom surface of the semiconductor substrate 104 by a separation B. Further, a sum of the separations A and B equals the thickness Ts.

A backside dielectric layer 114 is on the backside 104b of the semiconductor substrate 104 and partially defines a pad opening 116 within which the stilted pad structure 102 is exposed. As such, the backside dielectric layer 114 and the semiconductor substrate 104 define a first common sidewall and a second common sidewall. The first and second common sidewalls are respectively on opposite sides of the stilted pad structure 102, and the recessed surface 104r extends laterally from the first common sidewall to the second common sidewall.

A backside liner layer 118 covers the backside dielectric layer 114. Further, the backside liner layer 118 lines the first and second common sidewalls and the recessed surface 104r. Portions of the backside liner layer 118 on the recessed surface 104r separate the recessed surface 104r from the stilted pad structure 102.

Backside spacers 120 are on sidewalls of the backside liner layer 118 at the first and second common sidewalls and are further on sidewalls of the semiconductor substrate 104 at the pad protrusions 102p. Backside spacers 120 at the first and second common sidewalls are separated from the stilted pad structure 102 by the pad opening 116. Further, backside spacers 120 at the pad protrusions 102p separate the pad protrusions 102p from the semiconductor substrate 104 and the backside liner layer 118.

In some embodiments, the thickness Ts of the semiconductor substrate 104 is about 1-100 micrometers, about 1-50 micrometers, about 50-100 micrometers, or some other suitable value. In some embodiments, the thickness Ts of the semiconductor substrate 104 is about 3.5 micrometers, about 5 micrometers, about 6 micrometers, or some other suitable value.

In some embodiments, the separation A is less than the separation B. In other embodiments, the separation A is greater than or equal to the separation B. In some embodiments, the separation A is about 3 micrometers or is less than about 3 micrometers, and/or the separation B is about 3 micrometers or is more than about 3 micrometers. If the separation A is too large (e.g., greater than about 3 micrometers or some other suitable value), a backside topography may have a large degree of variation that may decrease the process window (e.g., resiliency) for forming other structures on the backside 104b.

In some embodiments, the stilted pad structure 102 is or comprises metal and/or some other suitable conductive material(s). The metal may, for example, be or comprise aluminum copper, copper, aluminum, tungsten, some other suitable metal(s), or any combination of the foregoing. In some embodiments, a width Wp of the pad protrusions 102p is about 5 micrometers, about 2-10 micrometers, about 10-30 micrometers, some other suitable value, or any combination of the foregoing. In some embodiments, the length L of the pad protrusions 102p is about 6 micrometers, about 5-50 micrometers, about 50-100 micrometers, some other suitable value, or any combination of the foregoing.

In some embodiments, the semiconductor substrate 104 is or comprises a bulk substrate of semiconductor material, a semiconductor-on-insulator (SOI) substrate, or some other suitable type of semiconductor substrate. In some embodiments, the semiconductor substrate 104 is or comprises silicon, silicon germanium, germanium, some other suitable type(s) of semiconductor material, or any combination of the foregoing. For example, the semiconductor substrate 104 may be a bulk substrate of monocrystalline silicon or silicon germanium.

In some embodiments, the frontside trench isolation structure 106 is or comprises a dielectric material and/or some other suitable material. The dielectric material may, for example, be or comprise silicon oxide and/or some other suitable dielectric material(s). In some embodiments, the frontside trench isolation structure 106 is a shallow trench isolation (STI) structure, a deep trench isolation (STI) structure, some other suitable type of trench isolation structure, or any combination of the foregoing.

In some embodiments, the pad wire 108p is or comprises metal and/or some other suitable conductive material(s). The metal may, for example, be or comprise aluminum copper, copper, aluminum, some other suitable metal(s), or any combination of the foregoing. In some embodiments, the frontside interconnect dielectric layer 112 is or comprises silicon oxide, a low k dielectric material, some other suitable dielectric(s), or any combination of the foregoing.

In some embodiments, the backside dielectric layer 114 is or comprises silicon oxide, a high k dielectric material, some other suitable dielectric(s), or any combination of the foregoing. The high k dielectric material may, for example, be or comprise aluminum oxide (e.g., $Al_2O_3$), hafnium oxide (e.g., $HfO_2$), tantalum oxide (e.g., $Ta_2O_5$), some other suitable high k dielectric(s), or any combination of the foregoing. In some embodiments, the backside dielectric layer 114 is a multilayer film. For example, the backside dielectric layer 114 may comprises multiple high k dielectric layers vertically stacked and an oxide layer covering the multiple high k dielectric layers.

In some embodiments, the backside liner layer 118 is or comprises silicon nitride, silicon oxide, some other suitable dielectric(s), or any combination of the foregoing. In some embodiments, the backside liner layer 118 is a multilayer film. For example, the backside liner layer 118 may comprise an oxide layer and a silicon nitride layer covering the oxide layer. As another example, the backside liner layer 118 may be or comprise an oxide-nitride-oxide (ONO) multilayer film. In some embodiments, the backside spacers 120 are or comprises silicon oxide, silicon nitride, silicon oxynitride, some other suitable dielectric(s), or any combination of the foregoing.

Figure 2:
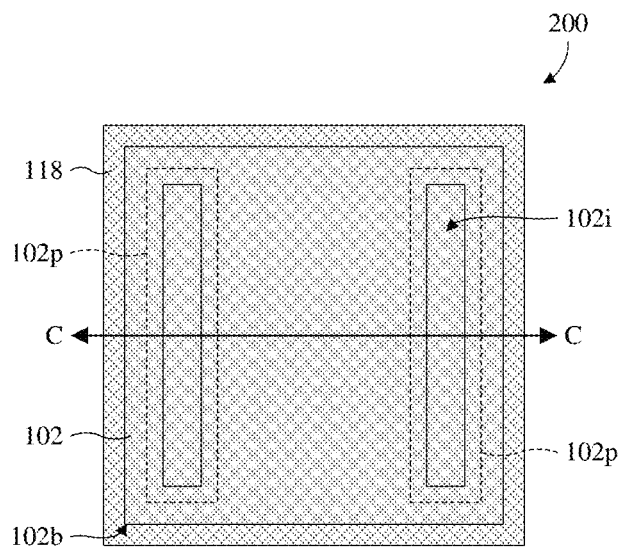
FIG. 2 provides a top layout view of some embodiments of the IC chip of FIG. 1.

With reference to FIG. 2, a top layout view 200 of some embodiments of the stilted pad structure 102 of FIG. 1 is provided. In some embodiments, the cross-sectional view 100 of FIG. 1 is taken along line C-C. The pad protrusions 102p have line-shaped top layouts that are laterally elongated in parallel. In some alternative embodiments, the pad protrusions 102p have some other suitable top layouts. Further, some in alternative embodiments, the pad protrusions 102p correspond to segments of a ring-shaped pad protrusion.

With reference to FIGS. 3A-3H, cross-sectional views 300A-300H of some alternative embodiments of the IC chip of FIG. 1 are provided.

Figure 3A:
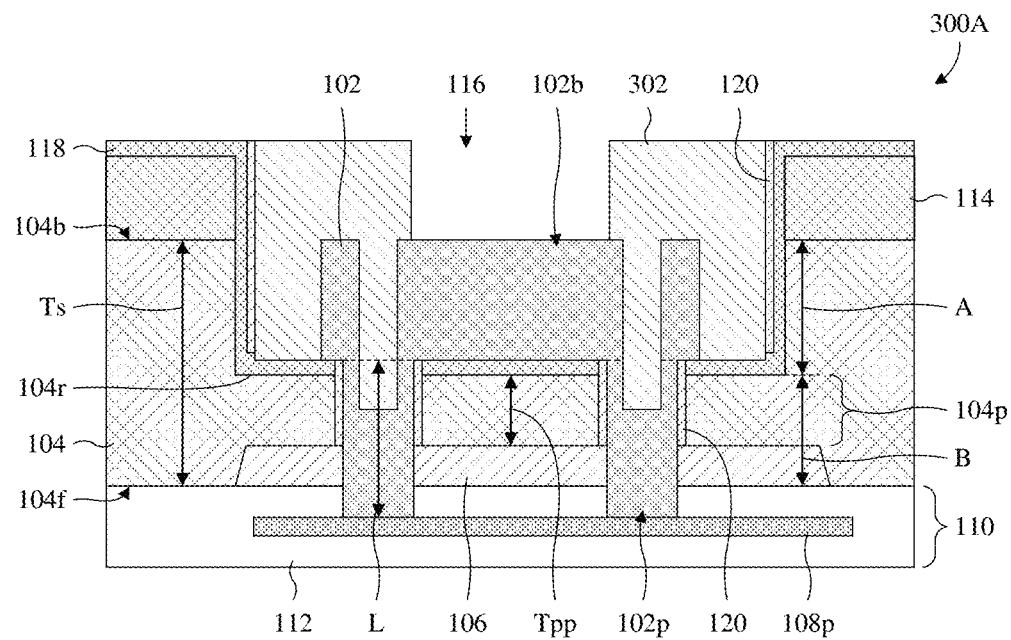
FIGS. 3A-3H provide cross-sectional views of some alternative embodiments of the IC chip of FIG. 1 in which the stilted pad structure is varied.

In FIG. 3A, a dielectric filler layer 302 overlies the stilted pad structure 102 and fills the indents 102*i* of FIG. 1 and the gaps of FIG. 1 at sides of the stilted pad structure 102. Further, the dielectric filler layer 302 localizes the pad opening 116 directly over the pad body 102*b* and has a top surface that is level with, or about level with, a top surface of the backside liner layer 118. In some embodiments, the dielectric filler layer 302 is or comprises silicon oxide, silicon nitride, silicon oxynitride, some other suitable dielectrics, or any combination of the foregoing.

Because the dielectric filler layer 302 reduces a size of the pad opening 116 and has a top surface level with, or about level with, the top surface of the backside liner layer 118, backside topography may have a small degree of variation at the stilted pad structure 102. Because of the small degree of variation, the process window (e.g., resiliency) for forming other structures on the backside 104*b* of the semiconductor substrate 104 may be large.

As described above, positioning of the pad body 102*b* is independent of variations in the thickness Ts of the semiconductor substrate 104 because the pad body 102*b* is separated from the frontside trench isolation structure 106 by the pad portion 104*p*. Instead of varying the positioning of the pad body 102*b* for variations in the thickness Ts of the semiconductor substrate 104, the thickness Tpp of the pad portion 104*p* may instead be varied. Because the positioning of the pad body 102*b* may be independent of the variations in the thickness Ts, the dielectric filler layer 302 may not vary with variations in the thickness Ts. Hence, formation of the dielectric filler layer 302 may not be subject to costly and time-consuming tuning of process parameters for variations in the thickness Ts.

Figure 3B:
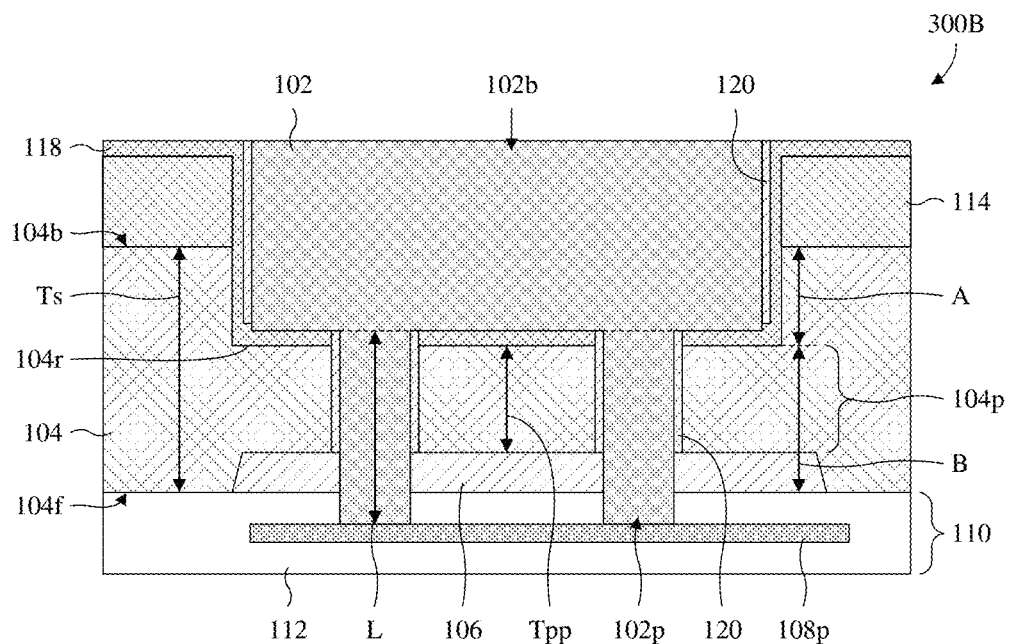

In FIG. 3B, the pad opening 116 is omitted and a top surface of the pad body 102*b* is level with, or about level with, a top surface of the backside liner layer 118. Accordingly, backside topography may have a small degree of variation at the stilted pad structure 102. Because of the small degree of variation, the process window (e.g., resiliency) for forming other structures on the backside 104*b* of the semiconductor substrate 104 may be large.

Figure 3C:
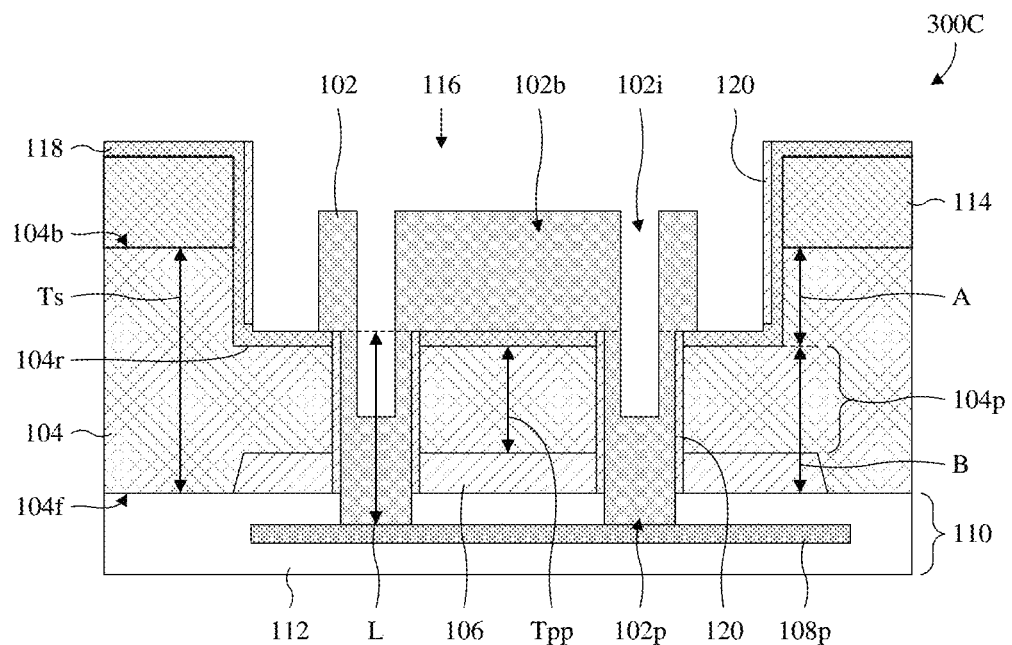

In FIG. 3C, the backside spacers 120 at the pad protrusions 102*p* further extend through the frontside trench isolation structure 106.

Figure 3D:
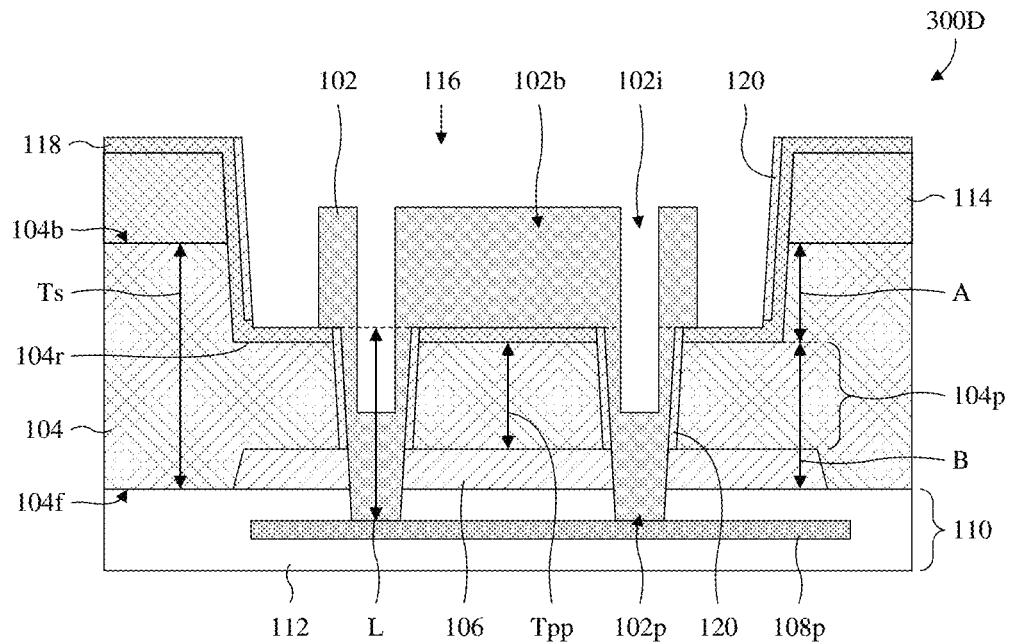

In FIG. 3D, the first and second common sidewalls defined by the semiconductor substrate 104 and the backside dielectric layer 114 are angled. Further, the sidewalls of the semiconductor substrate 104 at the pad protrusions 102*p* are angled. In alternative embodiments, the first and second common sidewalls are vertical and/or the sidewalls of the semiconductor substrate 104 at the pad protrusions 102*p* are vertical.

Figure 3E:
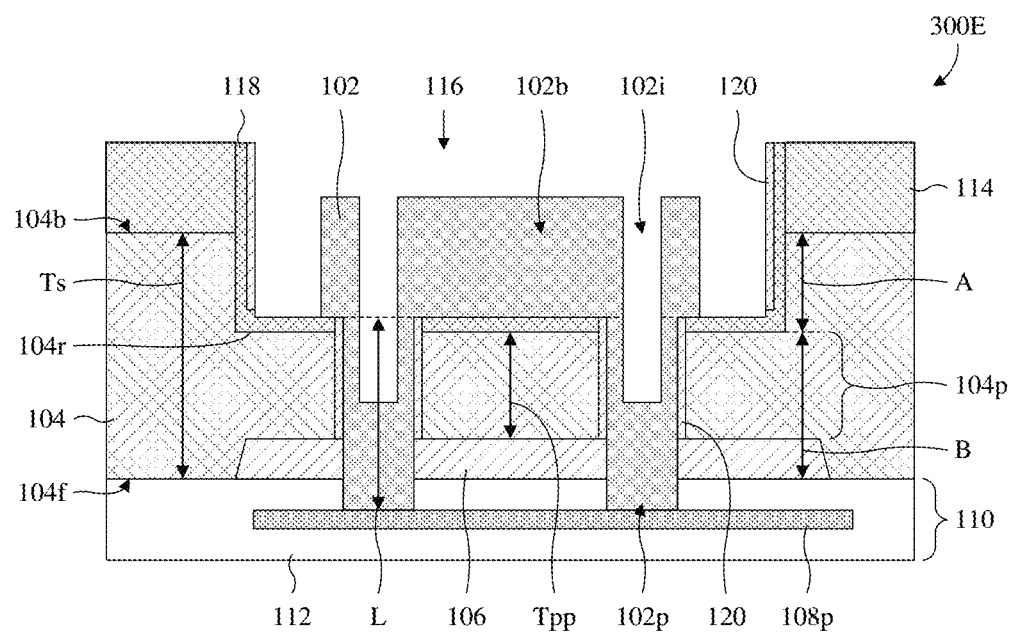

In FIG. 3E, the backside liner layer 118 has a top surface that is level with, or about level with, a top surface of the backside dielectric layer 114. As such, the backside dielectric layer 114 is not covered by the backside liner layer 118.

Figure 3F:
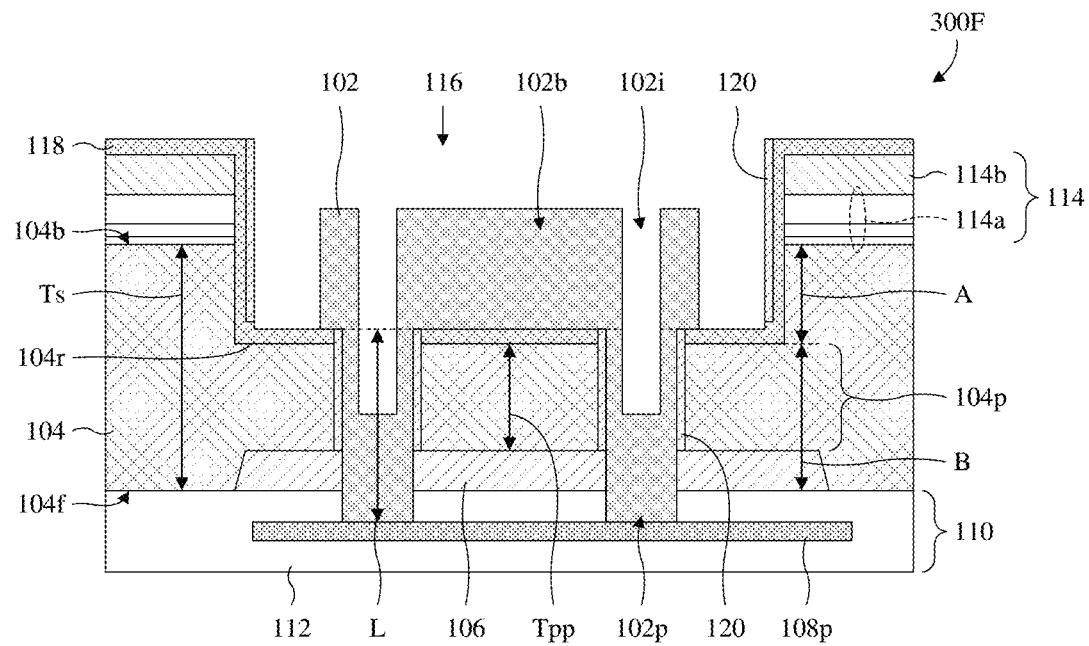

In FIG. 3F, the backside dielectric layer 114 comprises a multilayer high k dielectric film 114*a* and an oxide dielectric layer 114*b* covering the multilayer high k dielectric film 114*a*. The multilayer high k dielectric film 114*a* comprises three high k dielectric layers that are vertically stacked. In alternative embodiments, the multilayer high k dielectric film 114*a* comprises more or less high k dielectric layers. Note that the high k dielectric layers of the multilayer high k dielectric film 114*a* are not individually labeled.

In some embodiments, the high k dielectric layers of the multilayer high k dielectric film 114*a* have dielectric constants greater than that of the oxide dielectric layer 114*b*. In some embodiments, each high k dielectric layer of the multilayer high k dielectric film 114*a* is a different high k material than each other high k dielectric layer of the multilayer high k dielectric film 114*a*. In some embodiments, the oxide dielectric layer 114*b* is or comprise silicon oxide and/or some other suitable dielectric(s).

Figure 3G:
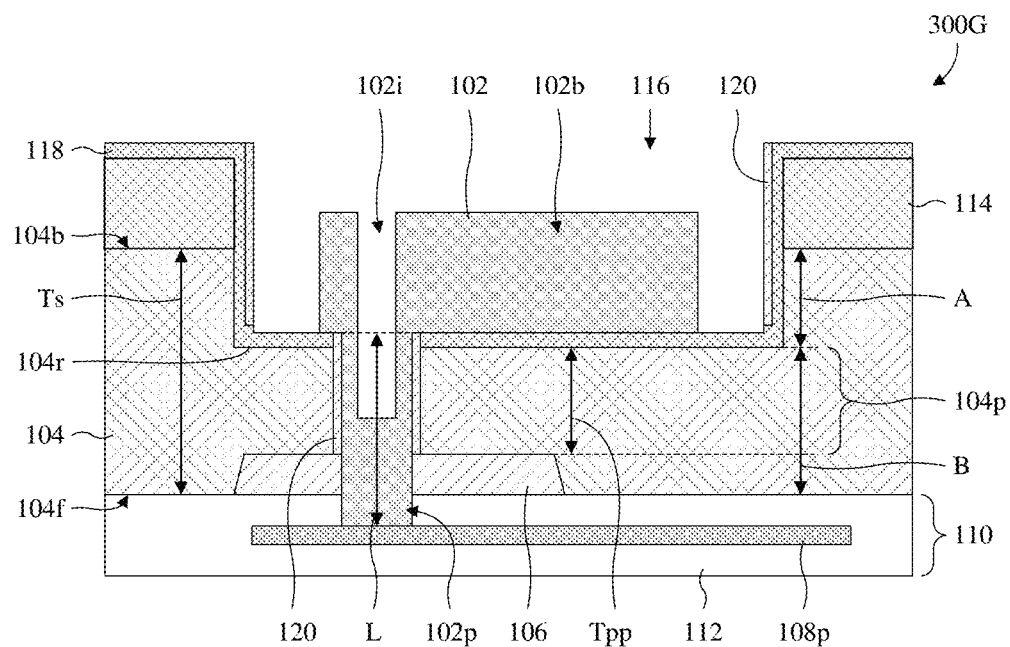

In FIG. 3G, the stilted pad structure 102 has a single pad protrusion 102*p*.

Figure 3H:
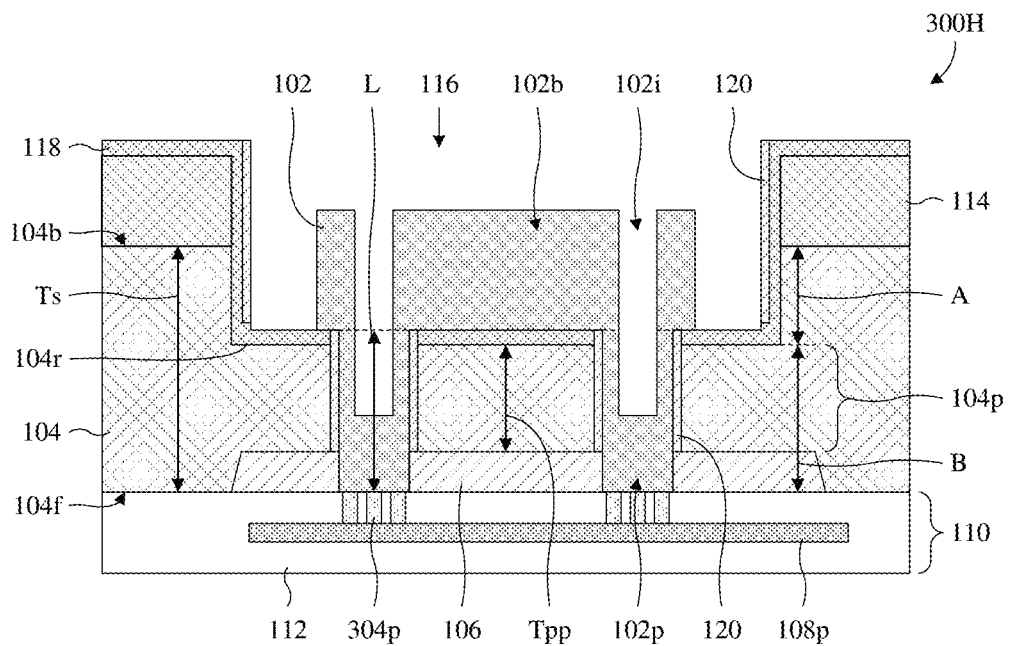

In FIG. 3H, the pad protrusions 102*p* protrude from the pad body 102*b* to a plurality of pad contacts 304*p*, and the plurality of pad contacts 304*p* extend from the pad wire 108*p* respectively to the pad protrusions 102*p*. As such, the pad contacts 304*p* electrically couple the pad wire 108*p* to the pad protrusions 102*p*. Additionally, an interface at which the pad contacts 304*p* directly contact the pad protrusions 102*p* is level with, or about level with, a bottom surface of the semiconductor substrate 104 and/or a bottom surface of the frontside trench isolation structure 106.

As seen hereafter, an etch may be performed to form an opening within which the pad protrusions 102*p* are formed. If the opening extends to and exposes the pad wire 108*p*, and if a thickness of the pad wire 108*p* is too small (e.g., as may be the case at advanced process nodes), over etching may lead to the opening extending fully through the pad wire 108*p*. The over etching may lead to poor electrical contact between the pad wire 108*p* and the pad protrusions 102*p*. For example, only sidewalls of the pad protrusions 102*p* may contact the pad wire 108*p*, whereby the contact area may be small and contact resistance may be high. Further, the over etching may lead to damage to structure underlying the pad wire 108*p* and/or electrical coupling of the stilted pad structure 102 to unintended conductive features under the pad wire 108*p*.

Because the pad protrusions 102*p* are separated from the pad wire 108*p* by the pad contacts 304*p*, the pad contacts 304*p* may serve as an etch stop for the etch. This may, in turn, protect the pad wire 108*p* and alleviate the foregoing concerns.

In some embodiments, the pad contacts 304*p* are contact vias or some other suitable type of contact structure. In some embodiments, the pad contacts 304*p* are or comprise metal and/or some other suitable conductive material(s). The metal may, for example, be or comprise copper, tungsten, some other suitable metal(s), or any combination of the foregoing.

While FIGS. 3C-3H describe variations to the IC chip of FIG. 1, the variations may also be applied to the IC chip of FIG. 3A and/or the IC chip of FIG. 3B. For example, the pad protrusions 102*p* of FIG. 3A may alternatively be separated from the pad wire 108*p* by pad contacts 304*p* as in FIG. 3H. As another example, FIG. 3B may alternatively have the backside spacers 120 at the pad protrusions 102*p* extending through the frontside trench isolation structure 106 as in FIG. 3C.

Figure 4A:
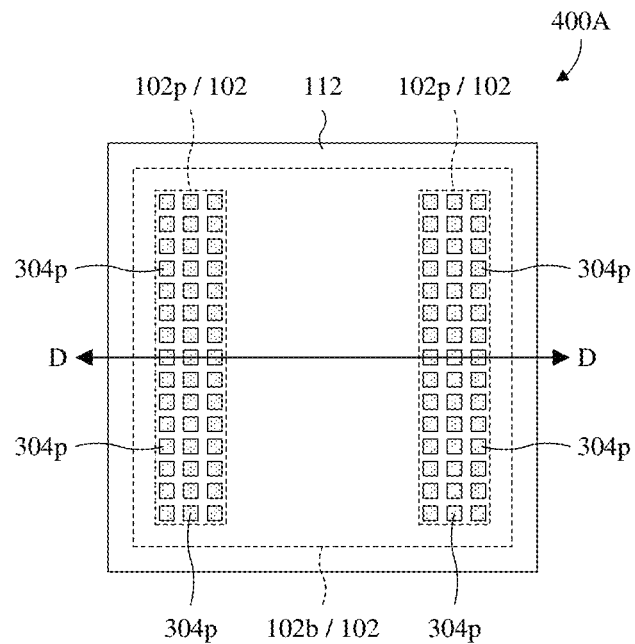
FIGS. 4A-4C provide top layout views of some embodiments of contacts of FIG. 3H.
Figure 4B:
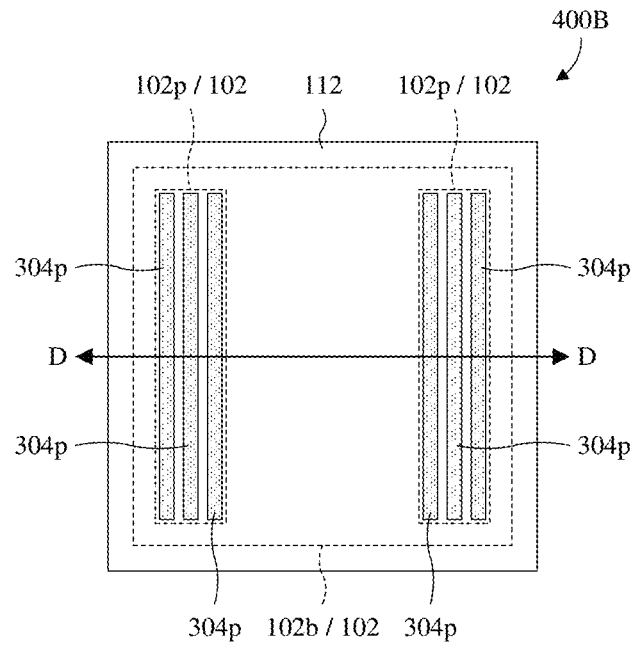
Figure 4C:
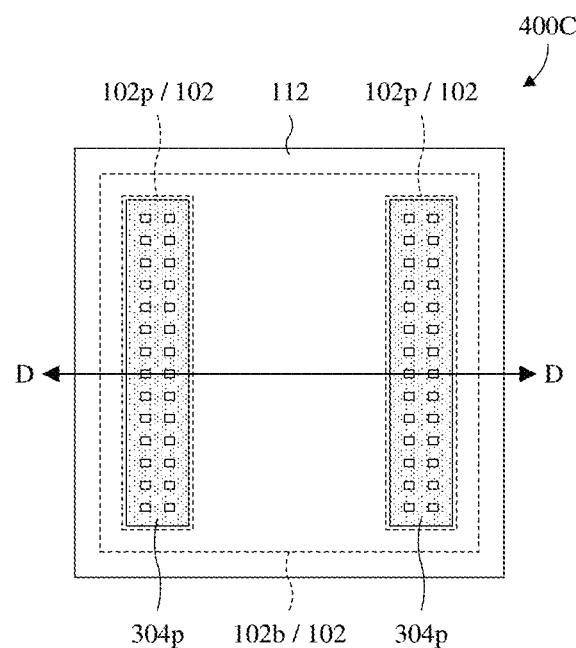

With reference FIGS. 4A-4C, top layout views 400A-400C of some embodiments of the pad contacts 304*p* of FIG. 3H are provided. In some embodiments, the cross-sectional view 300H of FIG. 3H is taken along line D-D.

In FIG. 4A, the pad contacts 304*p* are dot shaped and are arranged in a plurality of rows and a plurality of columns. Further, the pad contacts 304*p* are arranged in fifteen rows and three columns at each of the pad protrusions 102*p*. In alternative embodiments, the pad contacts 304*p* are in more or less rows and/or more or less columns at each of the pad protrusions 102*p*.

In FIG. 4B, the pad contacts 304p are line or strip shaped. Further, the pad contacts 304p are arranged in three columns at each of the pad protrusions 102p. In alternative embodiments, the pad contacts 304p are in more or less columns at each of the pad protrusions 102p.

In FIG. 4C, the pad contacts 304p are grid shaped.

Figure 5:
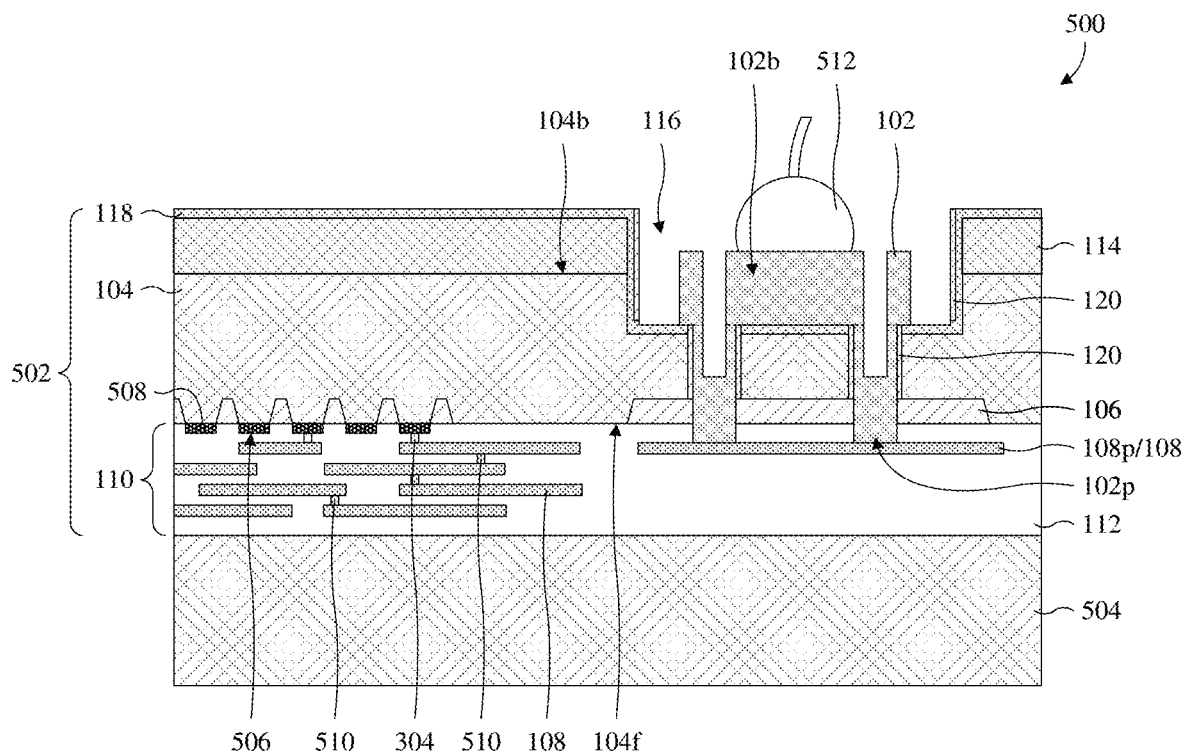
FIG. 5 provides a cross-sectional view of some embodiments of an IC package in which the IC chip of FIG. 1 is bonded to a carrier substrate.

With reference to FIG. 5, a cross-sectional view 500 of some embodiments of an IC package is provided in which the IC chip of FIG. 1 (hereafter referred to as the first IC chip 502) has additional structure and is bonded to a carrier substrate 504.

A plurality of semiconductor devices 506 is on the frontside 104f of the semiconductor substrate 104, between the semiconductor substrate 104 and the frontside interconnect structure 110. The semiconductor devices 506 are separated by the frontside trench isolation structure 106 and comprise individual gate stacks 508. While not shown, the gate stacks 508 may, for example, comprise individual gate electrodes and individual gate dielectric respectively separating the gate electrodes from the semiconductor substrate 104. The semiconductor devices 506 may, for example, be or comprise metal-oxide-semiconductor field-effect transistors (MOSFETs), fin field-effect transistors (FinFETs), gate-all-around field-effect transistors (GAA FETs), some other suitable type of semiconductor devices, or any combination of the foregoing.

The frontside interconnect structure 110 comprises a plurality of wires 108, a plurality of vias 510, and a plurality of contacts 304 embedded in the frontside interconnect dielectric layer 112. Further, the plurality of wires 108 comprises the pad wire 108p. The wires 108, the vias 510, and the contacts 304 are stacked to define conductive paths leading from and interconnecting the semiconductor devices 506 and the stilted pad structure 102. Further, the wires 108, the vias 510, and the contacts 304 are grouped into levels corresponding to elevation below the semiconductor substrate 104. The contacts 304 have a single contact level, whereas the wires 108 and the vias 510 respectively have a plurality of wire levels and a plurality of via levels. The wire levels and the via levels are alternatingly stacked between the contact level and the carrier substrate 504.

In some embodiments, the wires 108 and/or the vias 510 are or comprises metal and/or some other suitable conductive material(s). The metal may, for example, be or comprise aluminum copper, copper, aluminum, some other suitable metal(s), or any combination of the foregoing. In some embodiments, the contacts 304 are contacts vias or some other suitable type of contact structure. In some embodiments, the contacts 304 are or comprises metal and/or some other suitable conductive material(s). The metal may, for example, be or comprise tungsten and/or some other suitable metal(s).

The carrier substrate 504 underlies the first IC chip 502 on the frontside 104f of the semiconductor substrate 104. In some embodiments, the carrier substrate 504 is a bulk substrate of semiconductor material or some other suitable type of substrate. The semiconductor material may, for example, be or comprise silicon, silicon germanium, germanium, some other suitable type(s) of semiconductor material, or any combination of the foregoing.

A wire bond structure 512 is on the stilted pad structure 102 to provide electrical coupling from the stilted pad structure 102 to an external device or structure. In alternative embodiments, some other suitable type of conductive structure is on the stilted pad structure 102 to provide electrical coupling from the stilted pad structure 102 to the external device or structure. Further, the frontside interconnect structure 110 provides electrical coupling from the stilted pad structure 102 to the semiconductor devices 506. Hence, the frontside interconnect structure 110, the stilted pad structure 102, and the wire bond structure 512 may coordinate to define conductive paths between the external device or structure and the semiconductor devices 506.

Figure 6A:
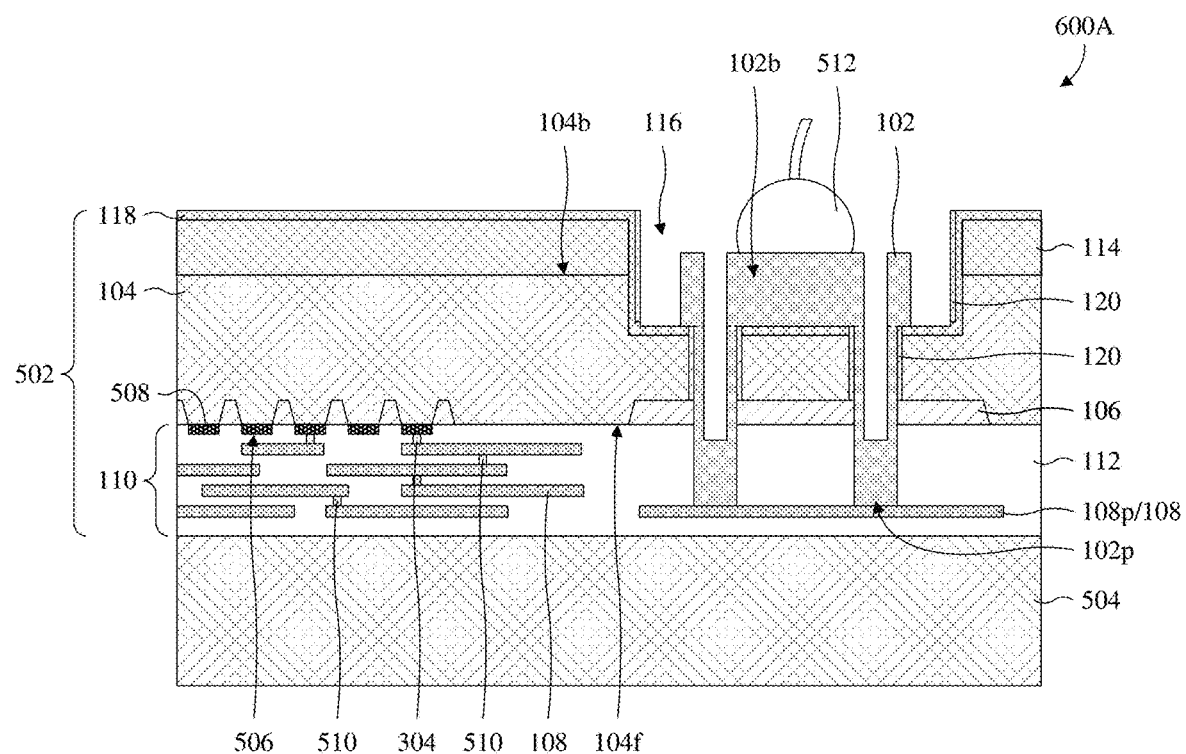
FIGS. 6A-6C provide cross-sectional views of some alternative embodiments of the IC package of FIG. 5.
Figure 6B:
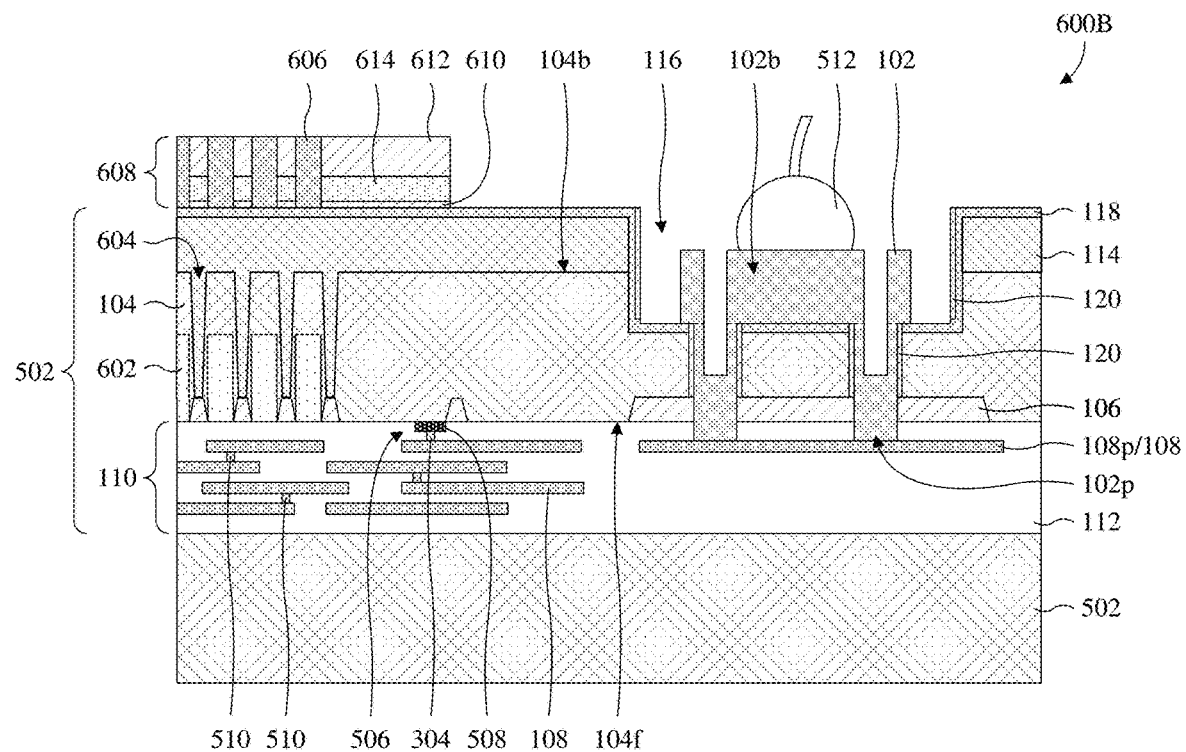

With reference to FIGS. 6A and 6B, cross-sectional views 600A and 600B of some alternative embodiments of the IC package of FIG. 5 are provided.

In FIG. 6A, the pad wire 108p is in a wire level that is closest to the carrier substrate 504. In some alternative embodiments, the pad wire 108p may be in any other wire level of the frontside interconnect structure 110.

In FIG. 6B, the first IC chip 502 is employed as a BSI image sensor. A plurality of photodetectors 602 extend into the frontside 104f of the semiconductor substrate 104, and the photodetectors 602 are separated by the frontside trench isolation structure 106. Further, the backside dielectric layer 114 protrudes into the backside 104b of the semiconductor substrate 104 to the frontside trench isolation structure 106 to define a backside trench isolation structure 604 further separating the photodetectors 602. In some embodiments, the frontside trench isolation structure 106 is a STI structure, whereas the backside trench isolation structure 604 is a DTI structure. Other suitable types of trench isolation structures are, however, amenable in alternative embodiments.

A plurality of color filters 606 and a composite grid 608 overlie the photodetectors 602 on the backside 104b of the semiconductor substrate 104. The color filters 606 are inset into the composite grid 608 and are each configure to pass first wavelengths of radiation while blocking second wavelengths of radiation.

The composite grid 608 comprises a first grid dielectric layer 610, a second grid dielectric layer 612, and a grid metal layer 614 between the first and second grid dielectric layers 610, 612. The grid metal layer 614 reflects incident radiation to direct the radiation towards the photodetectors 602. Further, the first and second grid dielectric layers 610, 612 have refractive indexes less than the color filters 606 to promote total internal reflection (TIR). Hence, the first and second grid dielectric layers 610, 612 may reflect incident radiation by TIR to direct the radiation towards the photodetectors 602. The aforementioned reflection may, in turn, enhance absorption of radiation received from the backside 104b of the semiconductor substrate 104.

Figure 6C:
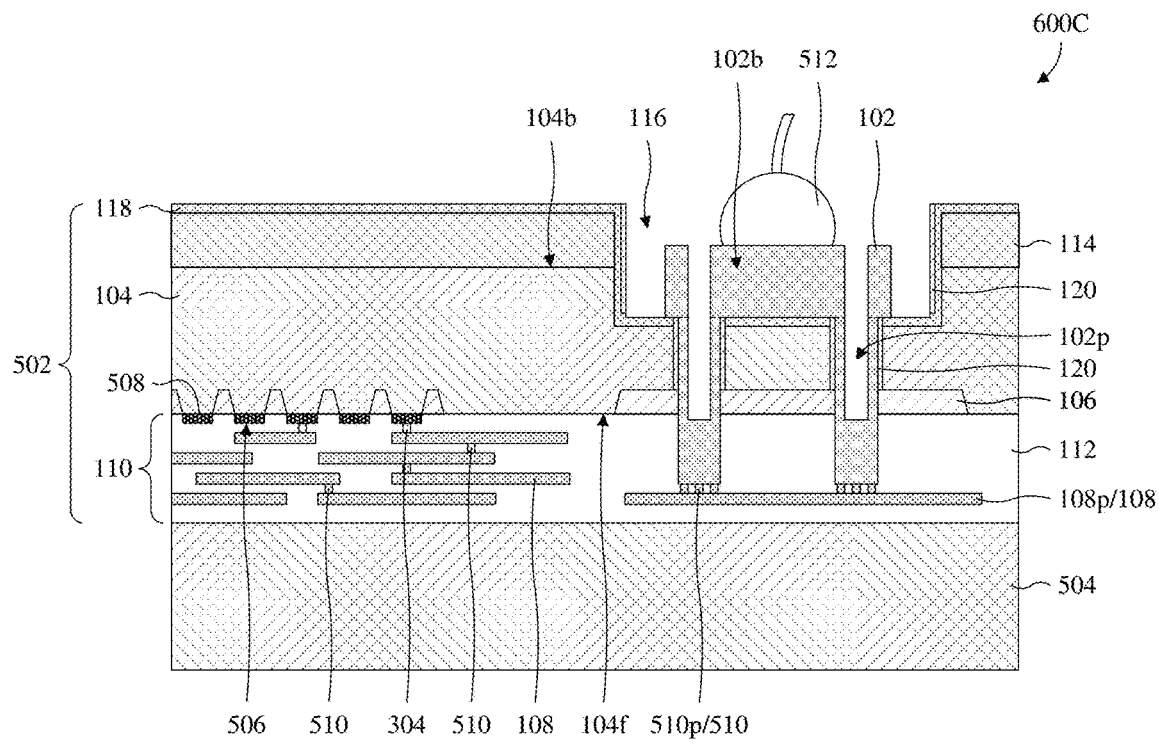

In FIG. 6C, the pad protrusions 102p protrude to pad vias 510p in a via level closest to the carrier substrate 504. In alternative embodiments, the pad vias 510p are in any other via level. For the same reasons described with regard to FIG. 3H, the pad vias 510p may protect the pad wire 108p from over etching.

Figure 7:
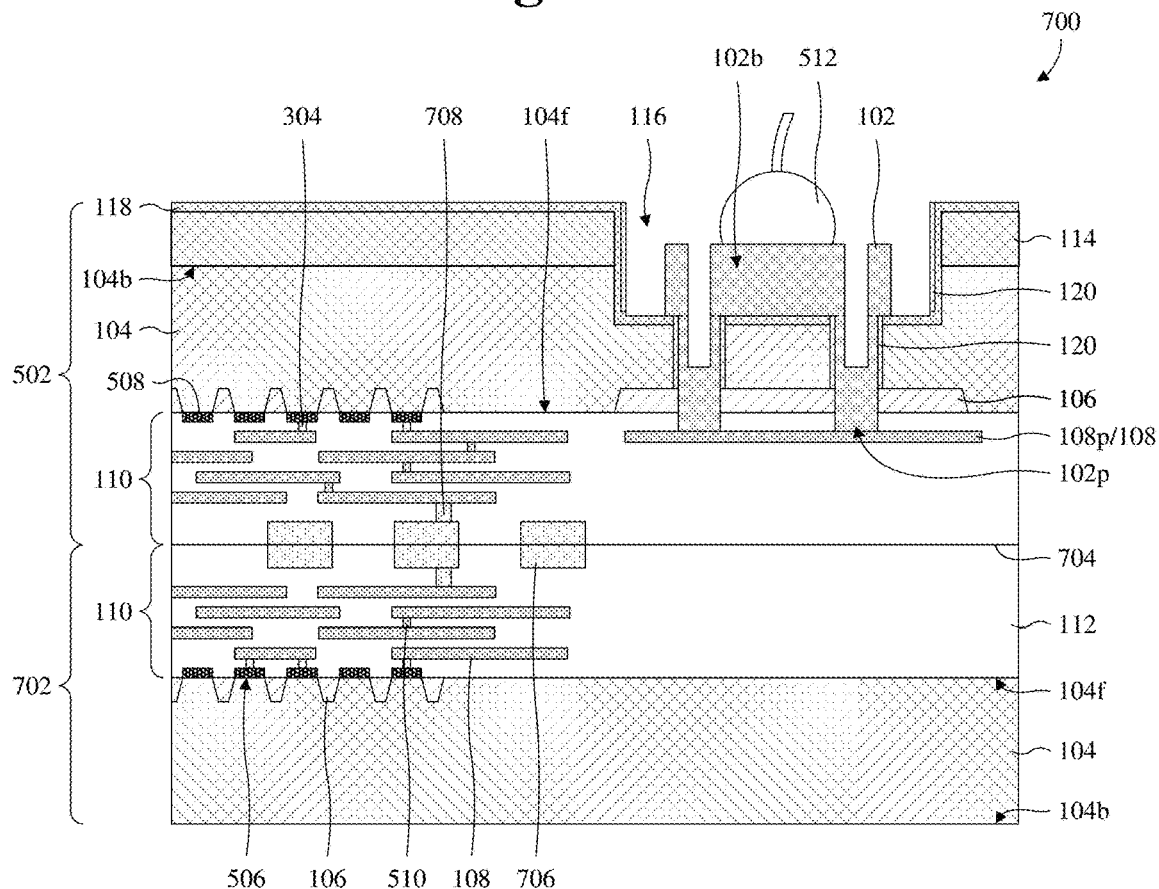
FIG. 7 provides a cross-sectional view of some embodiments of a three-dimensional (3D) IC package in which the IC chip of FIG. 5 and a second IC chip are bonded together frontside to frontside.

With reference to FIG. 7, a cross-sectional view 700 of some embodiments of a three-dimensional (3D) IC package is provided in which the first IC chip 502 of FIG. 5 is bonded to a second IC chip 702, instead of the carrier substrate 504 of FIG. 5, and has additional structure to facilitate the bond. The second IC chip 702 is as the first IC chip 502 is described, except that the second IC chip 702 lacks the stilted pad structure 102. Hence, constituents of the first and second IC chips 502, 702 share reference numbers.

The bonding is performed by hybrid bonding and bonds the first and second IC chips 502, 702 together frontside to frontside at a bond interface 704. Further, to facilitate the bonding, the first and second IC chips 502, 702 comprises individual hybrid bond pads 706 and individual hybrid bond vias 708. In some embodiments, the hybrid bond pads 706 and the hybrid bond vias 708 are or comprise aluminum copper, copper, aluminum, some other suitable metal(s), or any combination of the foregoing.

The hybrid bond pads 706 and the hybrid bond vias 708 are inset respectively into the frontside interconnect dielectric layers 112 of the first and second IC chips 502, 702. The frontside interconnect dielectric layers 112 of the first and second IC chips 502, 702 directly contact at the bond interface 704. Further, the hybrid bond pads 706 of the first IC chip 502 directly contact the hybrid bond pads 706 of the second IC chip 702 at the bond interface 704. The hybrid bond vias 708 of the first IC chip 502 extend respectively from hybrid bond pads 706 of the first IC chip 502 respectively to wires 108 of the first IC chip 502. The hybrid bond vias 708 of the second IC chip 702 extend respectively from hybrid bond pads 706 of the second IC chip 702 respectively to wires 108 of the second IC chip 702.

Figure 8A:
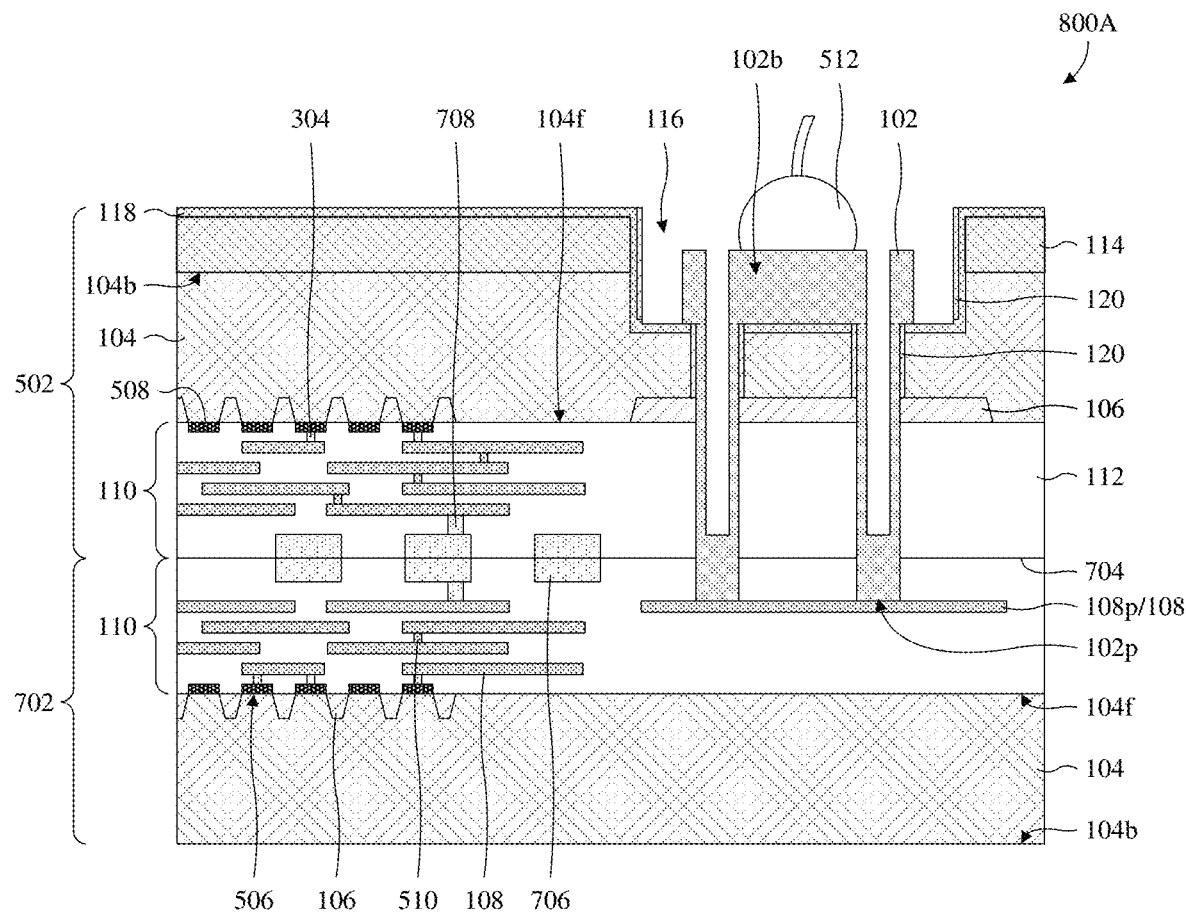
FIGS. 8A and 8B provide cross-sectional views of some alternative embodiments of the 3D IC package of FIG. 7 in which a pad wire is in the second IC chip.
Figure 8B:
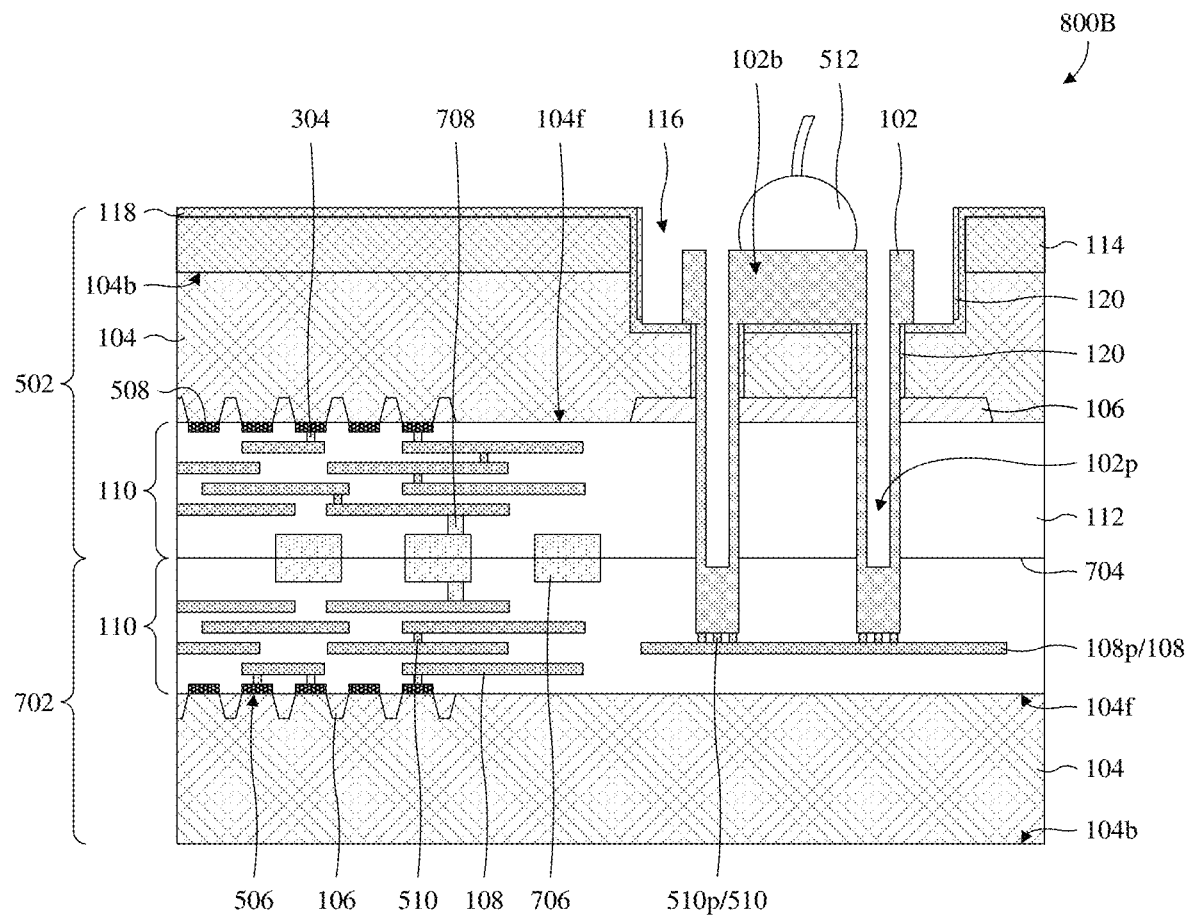

With reference to FIGS. 8A and 8B, cross-sectional views 800A, 800B of some alternative embodiments of the 3D IC package of FIG. 7 are provided in which the pad wire 108p is in the frontside interconnect structure 110 of the second IC chip 702. As a result, the pad protrusions 102p extend through frontside interconnect structure 110 of the first IC chip 502 to the frontside interconnect structure 110 of the second IC chip 702.

In FIG. 8A, the pad protrusions 102p extend to the pad wire 108p. Additionally, the pad wire 108p is in a wire level of the second IC chip 702 that is closest to the bond interface 704. In alternative embodiments, the pad wire 108p is in some other wire level of the first or second IC chip 502, 702.

In FIG. 8B, the pad protrusions 102p extend to pad vias 510p, which extend from the pad wire 108p to the pad protrusions 102p. In alternative embodiments, the pad wire 108p and the pad vias 510p are in some other wire and via levels of the first or second IC chip 502, 702.

While the pad protrusions 102p extend to the pad wire 108p and the pad vias 510p respectively in FIGS. 8A and 8B, the pad protrusions 102p may alternatively extend to hybrid bond vias 708, hybrid bond pads 706, or contacts 304 in either the first or second IC chip 502, 702. Increased thickness of hybrid bond pads 706 may alleviate over etching concerns discussed with regard to FIG. 3H. Similarly, hybrid bond vias 708 and contacts 304 may alleviate over etching concerns discussed with regard to FIG. 3H.

Figure 9:
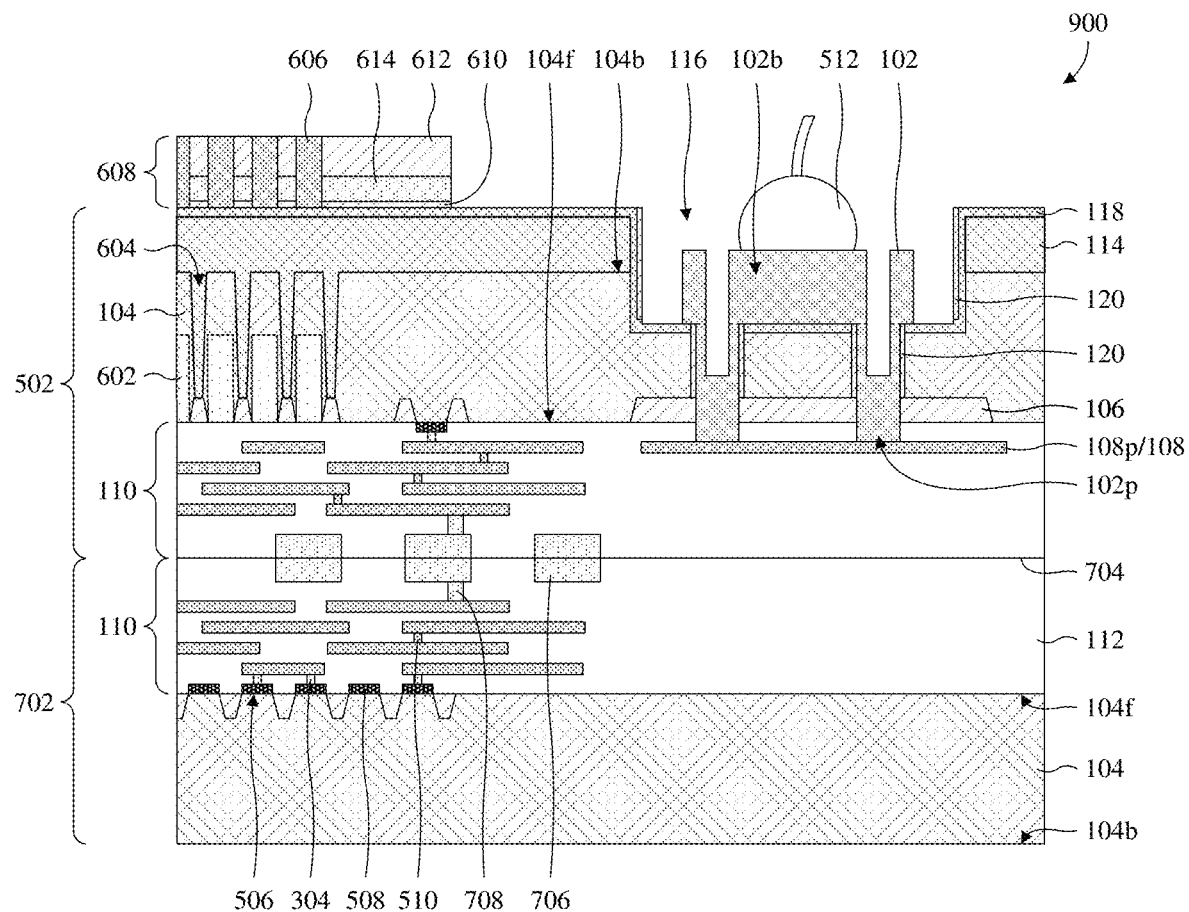
FIG. 9 provides a cross-sectional view of some alternative embodiments of the 3D IC package of FIG. 7 in which the IC chip is employed as a BSI image sensor.

With reference to FIG. 9, a cross-sectional view 900 of some alternative embodiments of the 3D IC package of FIG. 7 is provided in which the first IC chip 502 is employed as a BSI image sensor as described with regard to FIG. 6B. Hence, the first IC chip 502 comprises a plurality of photodetectors 602 extending into the frontside 104f of the first IC chip 502. Further, a plurality of color filters 606 and a composite grid 608 overlie the photodetectors 602 on the backside 104b of the first IC chip 502.

Figure 10:
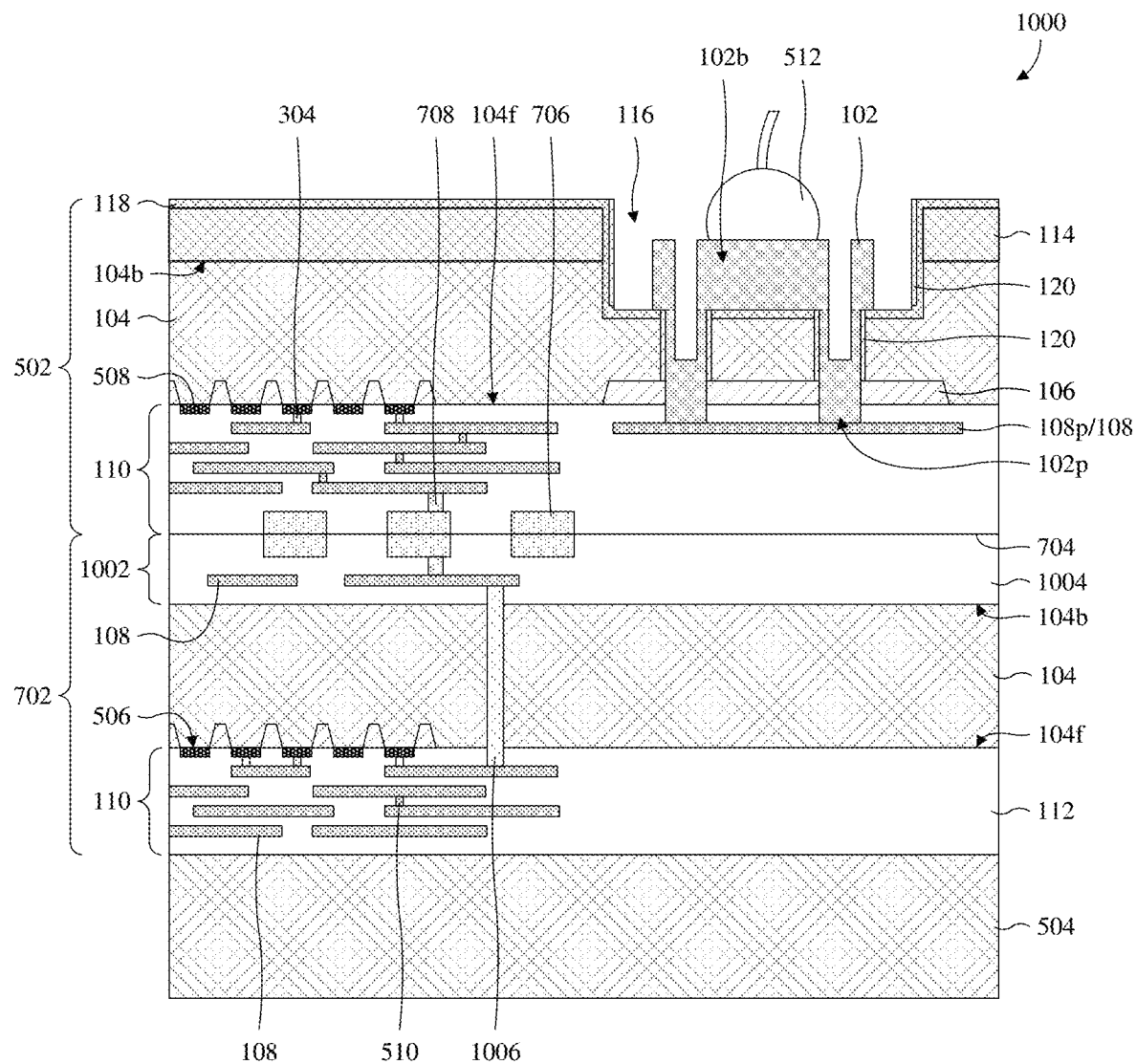
FIG. 10 provides a cross-sectional view of some alternative embodiments of the 3D IC package of FIG. 7 in which the IC chip and the second IC chip are bonded frontside to backside.

With reference to FIG. 10, a cross-sectional view 1000 of some alternative embodiments of the 3D IC package of FIG. 7 is provided in which the second IC chip 702 is bonded backside to frontside to the first IC chip 502. As such, the second IC chip 702 comprises a backside interconnect structure 1002 on the backside 104b of the second IC chip 702.

The backside interconnect structure 1002 comprises the hybrid bond pads 706 of the second IC chip 702 and the hybrid bond vias 708 of the second IC chip 702. As such, the hybrid bond pads 706 of the second IC chip 702 and the hybrid bond vias 708 of the second IC chip 702 are on the backside 104b of the second IC chip 702 rather than the frontside 104f of the second IC chip 702. Further, the backside interconnect structure 1002 comprises a plurality of wires 108 between the hybrid bond vias 708 of the second IC chip 702 and the semiconductor substrate 104 of the second IC chip 702. In some alternative embodiments, the backside interconnect structure 1002 comprises multiple levels of wires and further comprises one or more levels of vias (not shown) alternatingly stacked.

A backside interconnect dielectric layer 1004 accommodates the hybrid bond pads 706 of the second IC chip 702, the hybrid bond vias 708 of the second IC chip 702, and the wires 108 of the second IC chip 702. Further, a through substrate via (TSV) 1006 extends from the frontside interconnect structure 110 of the second IC chip 702, through the semiconductor substrate 104 of the second IC chip 702, to the backside interconnect structure 1002 to provide electrical coupling therebetween. In some embodiments, the wires 108 and/or the TSV 1006 are or comprises metal and/or some other suitable conductive material(s). The metal may, for example, be or comprise aluminum copper, copper, aluminum, tungsten, some other suitable metal(s), or any combination of the foregoing.

A carrier substrate 504 underlies the second IC chip 702 on the frontside 104f of the second IC chip 702 and is bonded to the second IC chip 702. The carrier substrate may, for example, be as described with regard to FIG. 5.

Figure 11A:
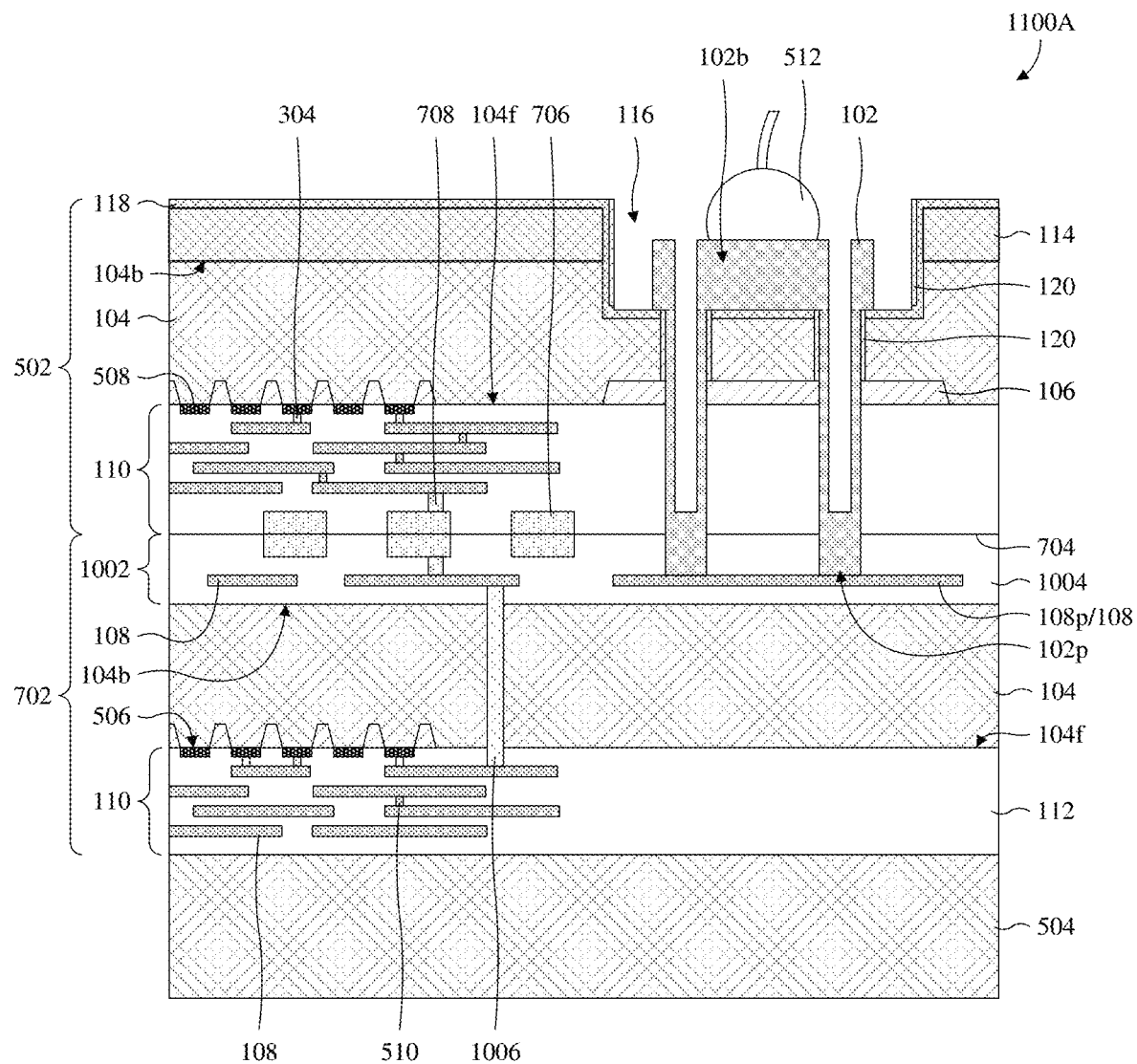
FIGS. 11A and 11B illustrate cross-sectional views of some alternative embodiments of the 3D IC package of FIG. 10.
Figure 11B:
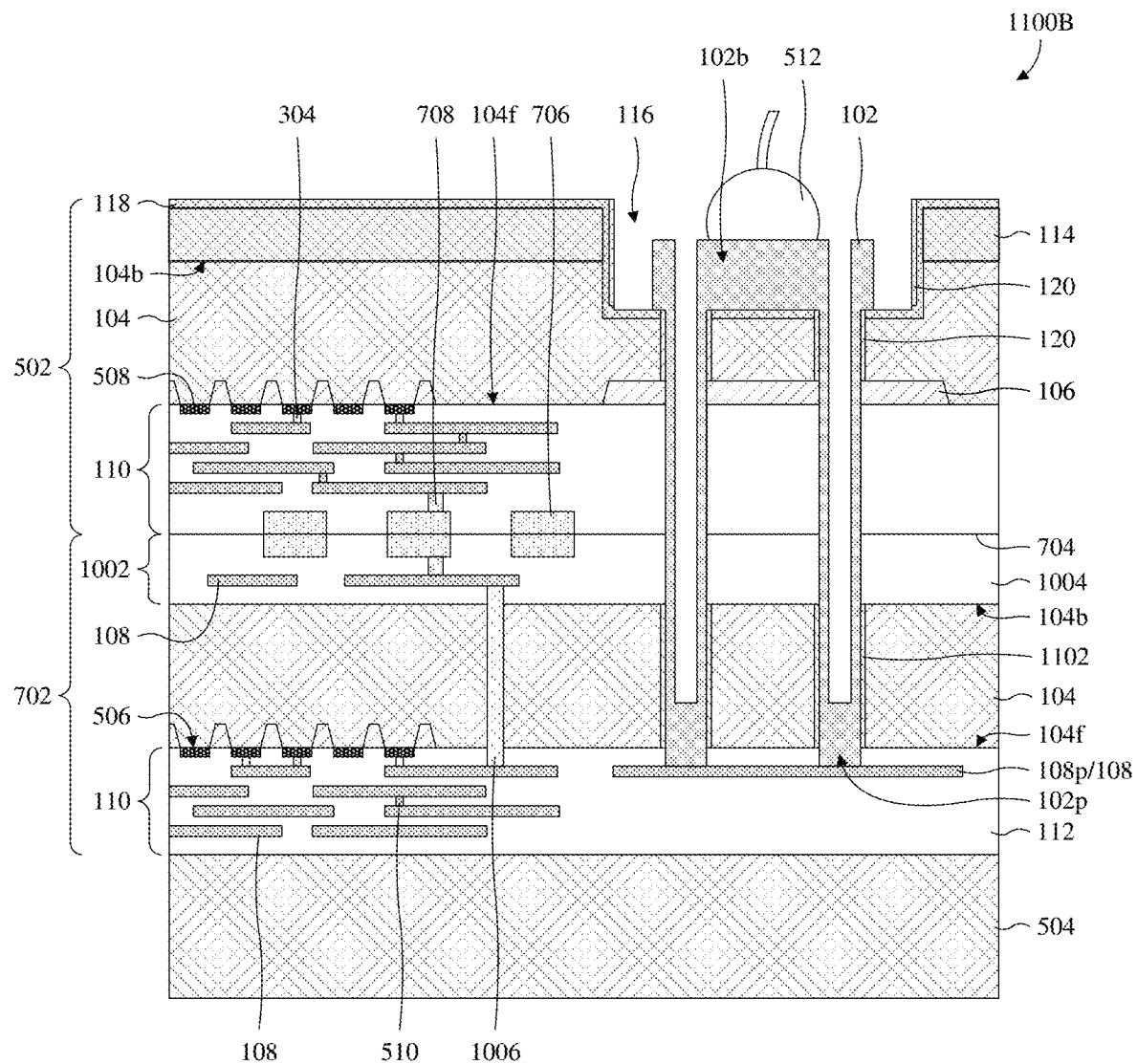

With reference to FIGS. 11A and 11B, cross-sectional views 1100A, 1100B of some alternative embodiments of the 3D IC package of FIG. 10 are provided.

In FIG. 11A, the pad wire 108p is in the backside interconnect structure 1002 of the second IC chip 702. In alternative embodiments, the pad protrusions 102p are separated from the pad wire 108p by the hybrid bond vias 708 of the second IC chip 702, such that the hybrid bond vias 708 extend from the pad wire 108p to the pad protrusions 102p.

In FIG. 11B, the pad wire 108p is in the frontside interconnect structure 110 of the second IC chip 702 in a wire level of the second IC chip 702 that is closest to the bond interface 704. As a result, the pad protrusions 102p extends through the semiconductor substrate 104 of the second IC chip 702 to the pad wire 108p. In alternative embodiments, the pad wire 108p is at a different wire level in the frontside interconnect structure 110 of the second IC chip 702. In alternative embodiments, the pad protrusions 102p extend to a vias 510 or contacts 304 of the second IC chip 702, which separate the pad protrusions 102p from the pad wire 108p and extend from the pad protrusions 102p to the pad wire 108p.

Through substrate spacers 1102 line the pad protrusions 102p at the semiconductor substrate 104 of the second IC chip 702 to separate the pad protrusions 102p from the semiconductor substrate 104 of the second IC chip 702. The through substrate spacers 1102 may, for example, be or comprise silicon oxide and/or some other suitable dielectric(s).

Figure 12:
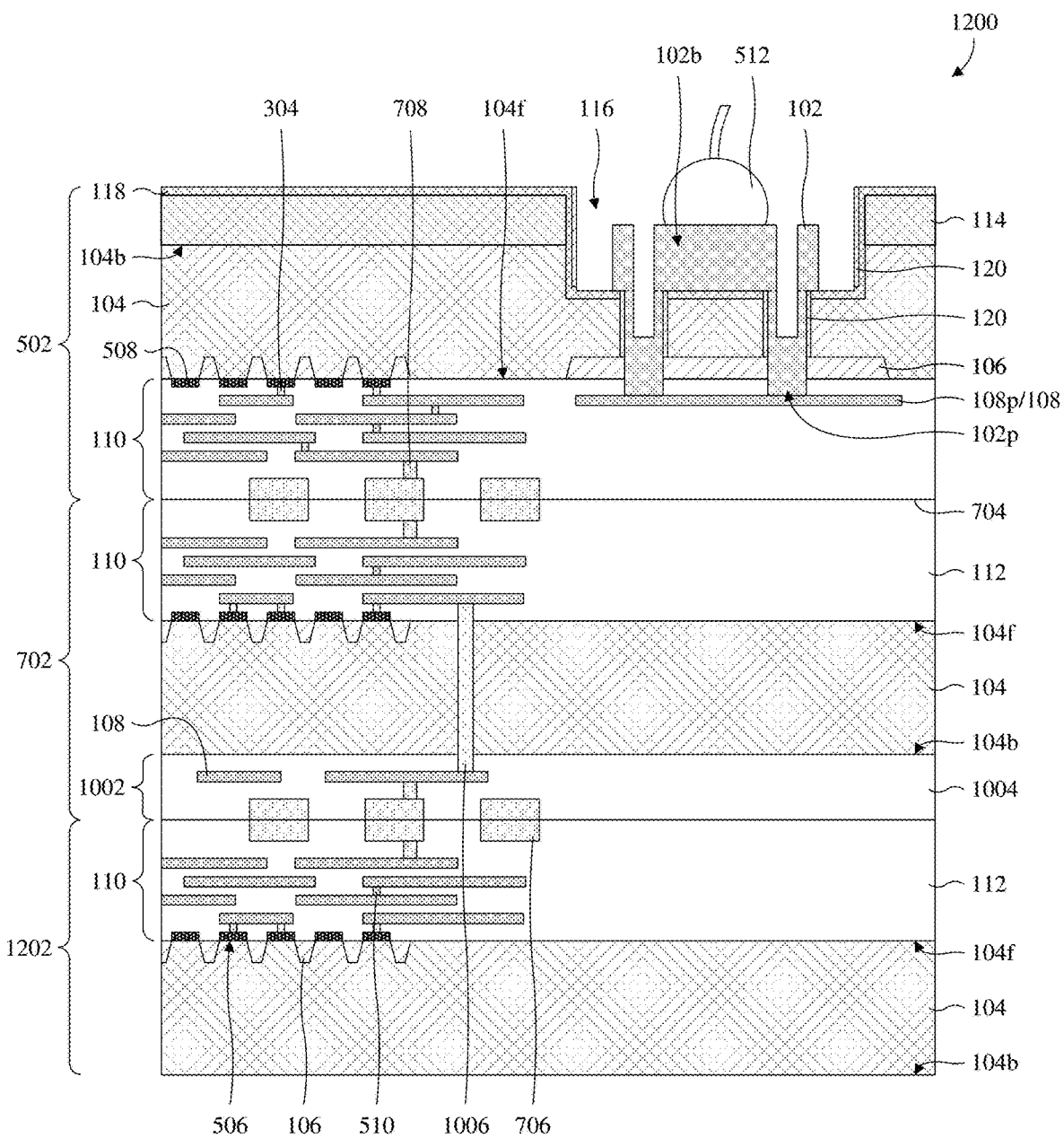
FIG. 12 provides a cross-sectional view of some alternative embodiments of the 3D IC package of FIG. 7 in which a third IC chip is bonded to the second IC chip.

With reference to FIG. 12, a cross-sectional view 1200 of some alternative embodiments of the 3D IC package of FIG. 7 is provided in which the second IC chip 702 is hybrid bonded to the first IC chip 502 on the frontside 104f of the second IC chip 702 and is hybrid bonded to a third IC chip 1202 on a backside 104b of the second IC chip 702.

The second IC chip 702 comprises the backside interconnect structure 1002 as described with regard to FIG. 10 and further comprises hybrid bond pads 706 and hybrid bond vias 708 on both the frontside 104f of the second IC chip 702 and the backside 104b of the second IC die. Further, the TSV 1006 extends through the semiconductor substrate 104 of the second IC chip 702 from the backside interconnect structure 1002 of the second IC chip 702 to the frontside interconnect structure 110 of the second IC chip 702.

The third IC chip 1202 is as the first IC chip 502 is described, except that the third IC chip 1202 lacks the stilted pad structure 102. Accordingly, constituents of the first and third IC chips 502, 1202 share reference numbers.

Figure 13A:
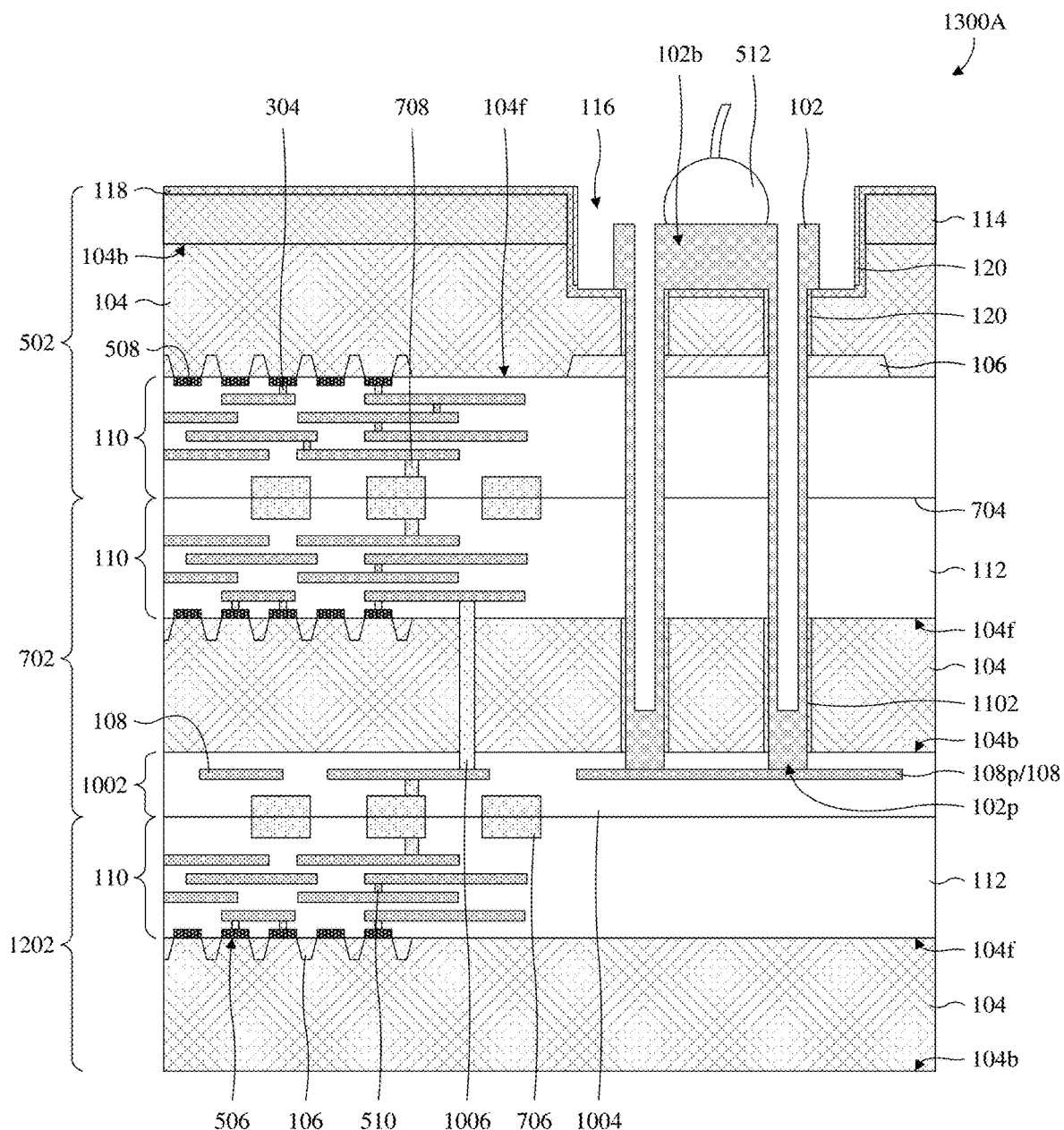
FIGS. 13A and 13B illustrate cross-sectional views of some alternative embodiments of the 3D IC package of FIG. 12.
Figure 13B:
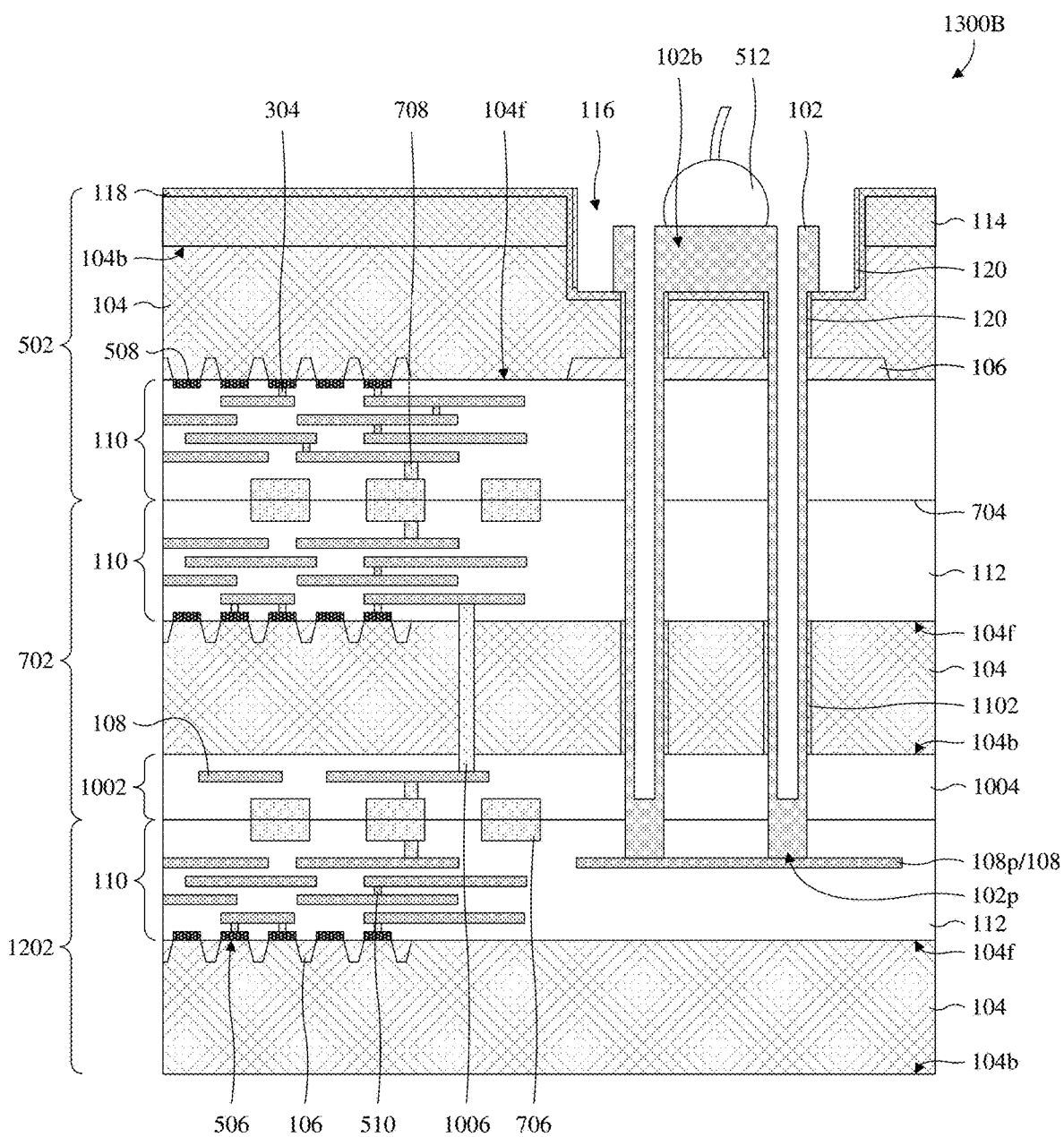

With reference to FIGS. 13A and 13B, cross-sectional views 1300A, 1300B of some alternative embodiments of the 3D IC package of FIG. 12 is provided.

In FIG. 13A, the pad wire 108p is in the backside interconnect structure 1002 of the second IC chip 702. As a result, the pad protrusions 102p extends through the semiconductor substrate 104 of the second IC chip 702 and is separated from the semiconductor substrate 104 of the second IC chip 702 by the through substrate spacers 1102.

In FIG. 13B, the pad wire 108p is in the frontside interconnect structure 110 of the third IC chip 1202. As a result, the pad protrusions 102p extends through the semiconductor substrate 104 of the second IC chip 702 and is separated from the semiconductor substrate 104 by the through substrate spacers 1102. In alternative embodiments, the pad wire 108p is at a different wire level in the frontside interconnect structure 110 of the third IC chip 1202. In alternative embodiments, the pad protrusions 102p extend to vias 510 of the third IC chip 1202, which separate the pad protrusions 102p from the pad wire 108p and extend from the pad protrusions 102p to the pad wire 108p.

Figure 14:
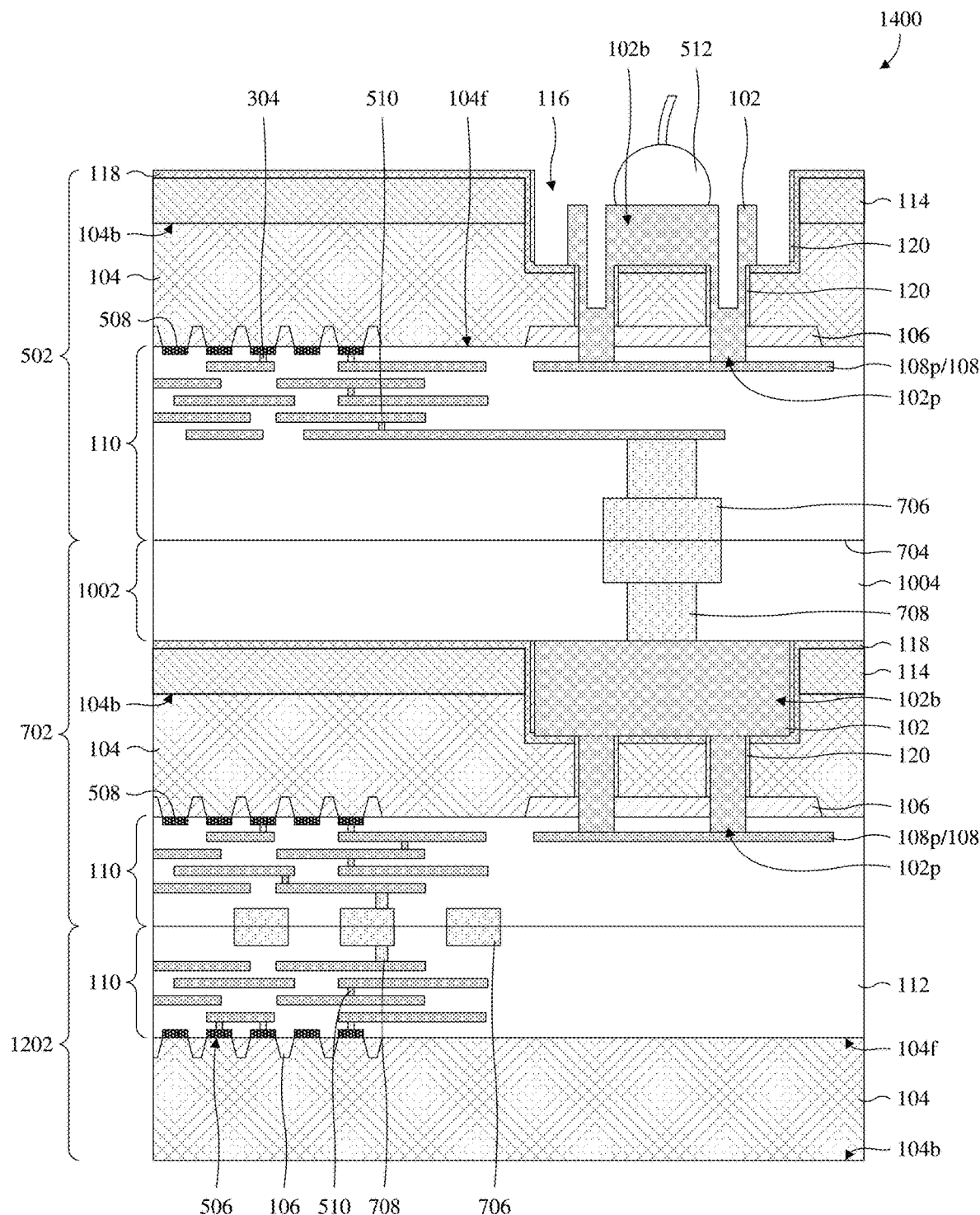
FIG. 14 illustrates a cross-sectional view of some alternative embodiments of the 3D IC chip of FIG. 12 in which the second IC chip is bonded backside to frontside to the IC chip.

With reference to FIG. 14, a cross-sectional view 1400 of some alternative embodiments of the 3D IC chip of FIG. 12 is provided in which the second IC chip 702 is bonded backside to frontside to the first IC chip 502. As such, the backside interconnect structure 1002 of the second IC chip 702 overlies the semiconductor substrate 104 of the second IC chip 702, and the frontside interconnect structure 110 of the second IC chip 702 underlies the semiconductor substrate 104. Additionally, the second IC chip 702 comprises a stilted pad structure 102 similar to the first IC chip 502.

The hybrid bond vias 708 and the hybrid bond pads 706 are larger at the first and second IC chips 502, 702 that at the second and third IC chips 702, 1202. Further, a hybrid bond via 708 of the second IC chip 702 extends from a hybrid bond pad 706 of the second IC chip 702 to the stilted pad structure 102 of the second IC chip.

The stilted pad structure 102 of the first IC chip 502 is configured as in FIG. 1, whereas the stilted pad structure 102 of the second IC chip 702 is configured as in FIG. 3B. In alternative embodiments, the stilted pad structure 102 of the first IC chip 502 and/or the stilted pad structure 102 of the second IC chip 702 has/have some other suitable configuration. In alternative embodiments, the stilted pad structure 102 of the second IC chip 702 protrudes to some other wire level of the second IC chip 702 or protrudes to a wire level in the third IC chip 1202. In alternative embodiments, the stilted pad structure 102 of the first IC chip 502 is separated from the pad wire 108p of the first IC chip 502 by contacts 304, or vias 510, of the first IC chip 502, which extend from the pad wire 108p to the pad protrusions 102p. Similarly, in alternative embodiments, the stilted pad structure 102 of the second IC chip 702 is separated from the pad wire 108p of the second IC chip 702 by contacts 304, or vias 510, of the second IC chip 702, which extend from the pad wire 108p to the pad protrusions 102p.

While FIGS. 5, 6A-6C, 7, 8A, 8B, 9, 10, 11A, 11B, 12, 13A, and 13B are illustrated using embodiments of the stilted pad structure 102 as in FIG. 1, it is to be appreciated that FIGS. 5, 6A-6C, 7, 8A, 8B, 9, 10, 11A, 11B, 12, 13A, and 13B may alternatively have embodiments of the stilted pad structure 102 in any of FIGS. 3A-3H. While FIG. 14 illustrates the stilted pad structure 102 of the first IC chip 502 using embodiments of the stilted pad structure 102 as in FIG. 1, it is to be appreciated that embodiments of the stilted pad structure 102 in any of FIGS. 3A-3H may alternatively be used. While FIG. 14 illustrates the stilted pad structure 102 of the second IC chip 702 using embodiments of the stilted pad structure 102 as in FIG. 3B, it is to be appreciated that embodiments of the stilted pad structure 102 in any of FIGS. 1, 3A, and 3C-3H may alternatively be used. Further, while FIGS. 6B and 9 illustrate the first IC chip 502 with the photodetectors 602, the backside trench isolation structure 604, the color filters 606, and the composite grid 608, it is to be appreciated that the first IC chip 502 in any of FIGS. 5, 6A, 7, 8A, 8B, 10, 11A, 11B, 12, 13A, 13B, and 14 may alternatively have the photodetectors 602, the backside trench isolation structure 604, the color filters 606, and the composite grid 608 as illustrated in FIGS. 6B and 9.

With reference to FIGS. 15-29, a series of cross-sectional views 1500-2900 of some embodiments of a method for forming an IC chip comprising a stilted pad structure is provided. The method may, for example, form the stilted pad structure as in FIG. 1.

Figure 15:
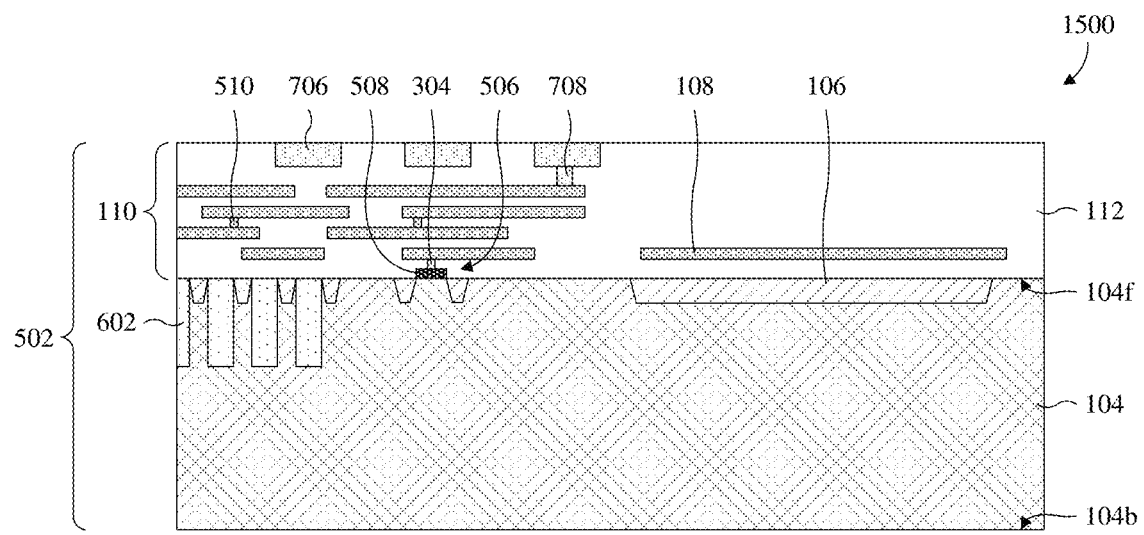
FIGS. 15-29 provide a series of cross-sectional views of some embodiments of a method for forming an IC chip comprising a stilted pad structure.

As illustrated by the cross-sectional view 1500 of FIG. 15, a first IC chip 502 is formed. A plurality of photodetectors 602 extends into a frontside 104f of a semiconductor substrate 104, and a semiconductor device 506 overlies and is partially defined by the frontside 104f of the semiconductor substrate 104. In alternative embodiments, the photodetectors 602 are replaced with additional semiconductor devices 506. The semiconductor device 506 comprises a gate stack 508 and, while not visible, further comprises a pair of source/drain regions between which the gate stack 508 is laterally sandwiched. A frontside trench isolation structure 106 extends into the frontside 104f of the semiconductor substrate 104 to separate the photodetectors 602 and the semiconductor device 506 from each other, and a frontside interconnect structure 110 covers and electrically couples to the semiconductor device 506.

The frontside interconnect structure 110 is embedded in a frontside interconnect dielectric layer 112 and comprises a contact 304, a plurality of wires 108, and a plurality of vias 510. The wires 108 and the vias 510 are respectively grouped into a plurality of wire levels and a plurality of via levels that are alternatingly stacked over the contact 304. The frontside interconnect structure 110 further comprises a plurality of hybrid bond pads 706 and a hybrid bond via over the wires 108 and the vias 510. The hybrid bond via 708 is over a top wire level, and the hybrid bond pads 706 are over the hybrid bond via 708.

Figure 16:
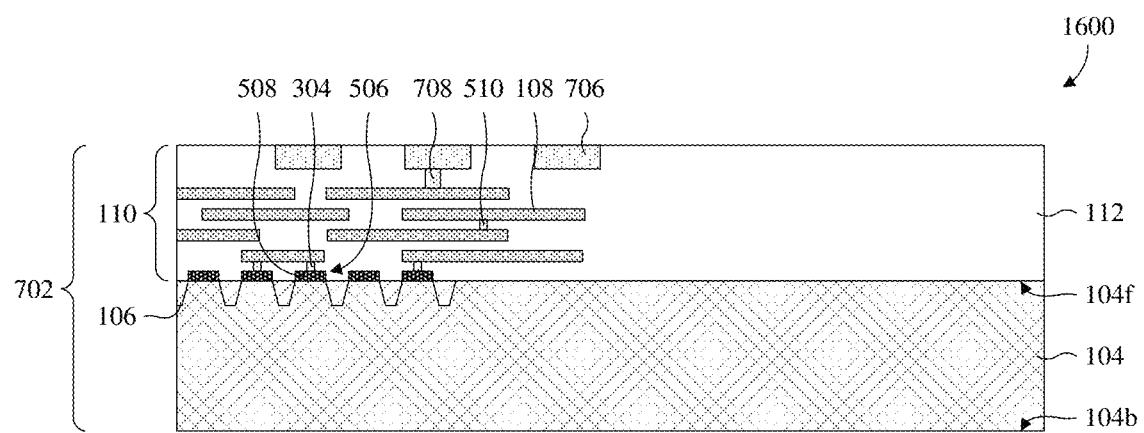

As illustrated by the cross-sectional view 1600 of FIG. 16, a second IC chip 702 is formed. The second IC chip 702 is as the first IC chip 502 is described, except that the second IC chip 702 lacks the photodetectors 602 and has more semiconductor devices 506. Further, the frontside interconnect structure 110 of the second IC chip 702 and the frontside trench isolation structure 106 of the second IC chip 702 have different layouts than counterparts in the first IC chip 502.

Figure 17:
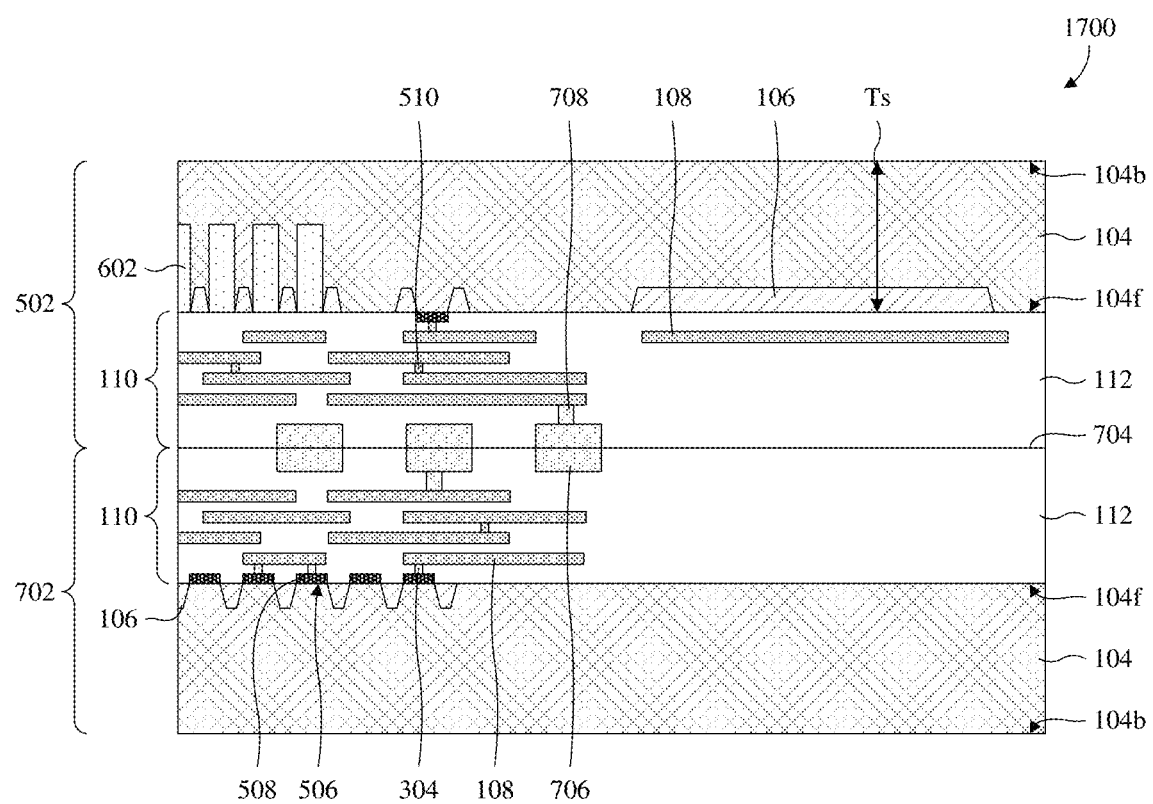

As illustrated by the cross-sectional view 1700 of FIG. 17, the first IC chip 502 is flipped vertically and is hybrid bonded to the second IC chip 702 at a bond interface 704. Further, the semiconductor substrate 104 of the first IC chip 502 is thinned from the backside 104b of the semiconductor substrate 104, thereby reducing a thickness Ts of the semiconductor substrate 104. The thinning may, for example, be performed by a chemical mechanical polish (CMP) or some other suitable thinning process.

Figure 18:
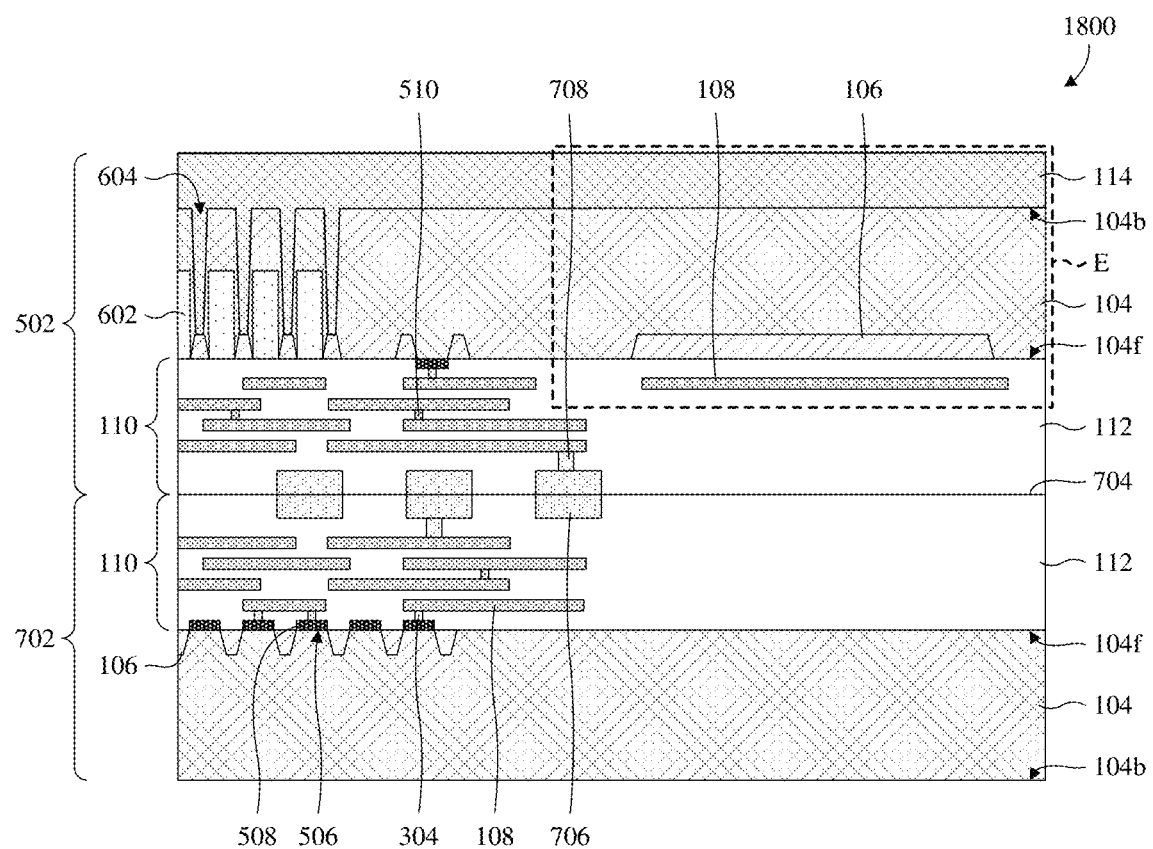

As illustrated by the cross-sectional view 1800 of FIG. 18, a backside dielectric layer 114 and a backside trench isolation structure 604 are formed on the backside 104b of the first IC chip 502. The backside trench isolation structure 604 extends into the backside 104b of the first IC chip 502 to the frontside trench isolation structure 106 of the first IC chip 502 to separate the photodetectors 602. The backside dielectric layer 114 blankets the backside 104b of the semiconductor substrate 104 and defines the backside trench isolation structure 604. In some embodiments, the backside dielectric layer 114 is or comprises silicon oxide, a high k dielectric material, some other suitable dielectric(s), or any combination of the foregoing. For example, the backside dielectric layer 114 may be or comprise silicon oxide or some other suitable oxide at a top surface of the backside dielectric layer 114. In some embodiments, the backside dielectric layer 114 is as described with regard to FIG. 3F.

A process for forming the backside dielectric layer 114 and a backside trench isolation structure 604 may, for example, comprise: patterning the backside 104b of the first IC chip 502 to form trenches separating the photodetectors 602; depositing the backside dielectric layer 114 filling the trenches and blanketing the backside 104b; and performing a planarization into the backside dielectric layer 114 to flatten a top surface of the backside dielectric layer 114. Other suitable processes are, however, amenable.

Hereafter, until noted otherwise, the cross-sectional views (e.g., the cross-sectional views 1900-2500 of FIGS. 19-25) correspond to box E of FIG. 18 to provide an enlarged view of the various processing steps performed to form a stilted pad structure.

Figure 19:
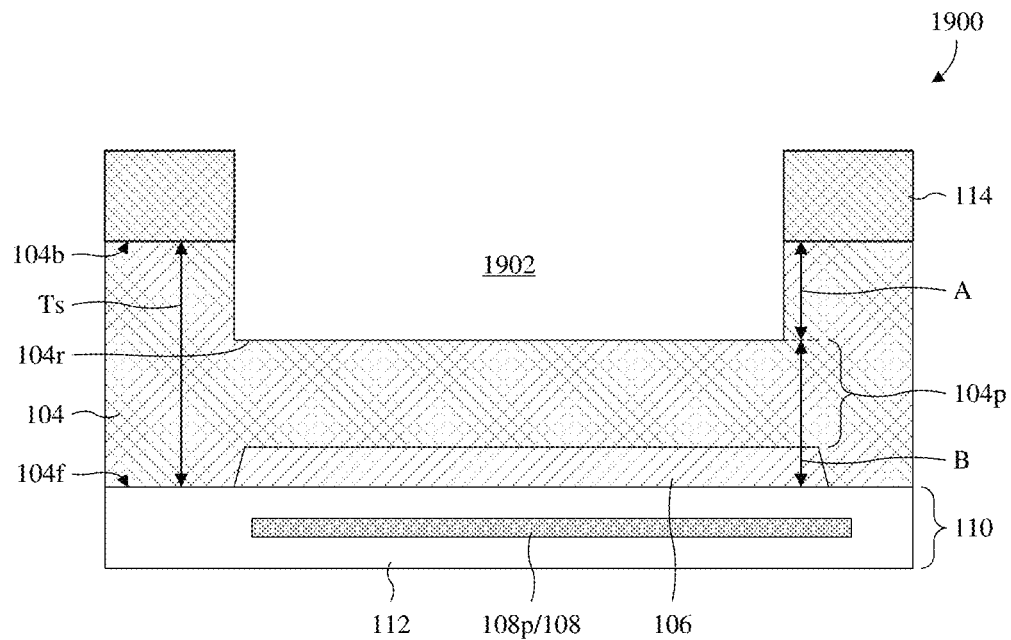

As illustrated by the cross-sectional view 1900 of FIG. 19, a first etch is performed selectively into the backside 104b of the semiconductor substrate 104 to form a first opening 1902. The first etch may, for example, be performed selectively by a photolithography/etching process or by some other suitable process.

The first opening 1902 extends through the backside dielectric layer 114 into the semiconductor substrate 104 and overlies a pad wire 108p. Further, the first opening 1902 is separated from the frontside trench isolation structure 106 by a pad portion 104p of the semiconductor substrate 104 and exposes a recessed surface 104r of the semiconductor substrate 104. The recessed surface 104r is recessed relative to a top surface of the semiconductor substrate 104 by a separation A, and is elevated relative to a bottom surface of the semiconductor substrate 104 by a separation B. Further, a sum of the separations A and B equals the thickness Ts of the semiconductor substrate 104. In some embodiments, the separation A is about 1.5 micrometers, about 1-3 micrometers, or some other suitable value, and/or the separation B is about 4.5 micrometers, about 4-10 micrometers, or some other suitable value.

Figure 20:
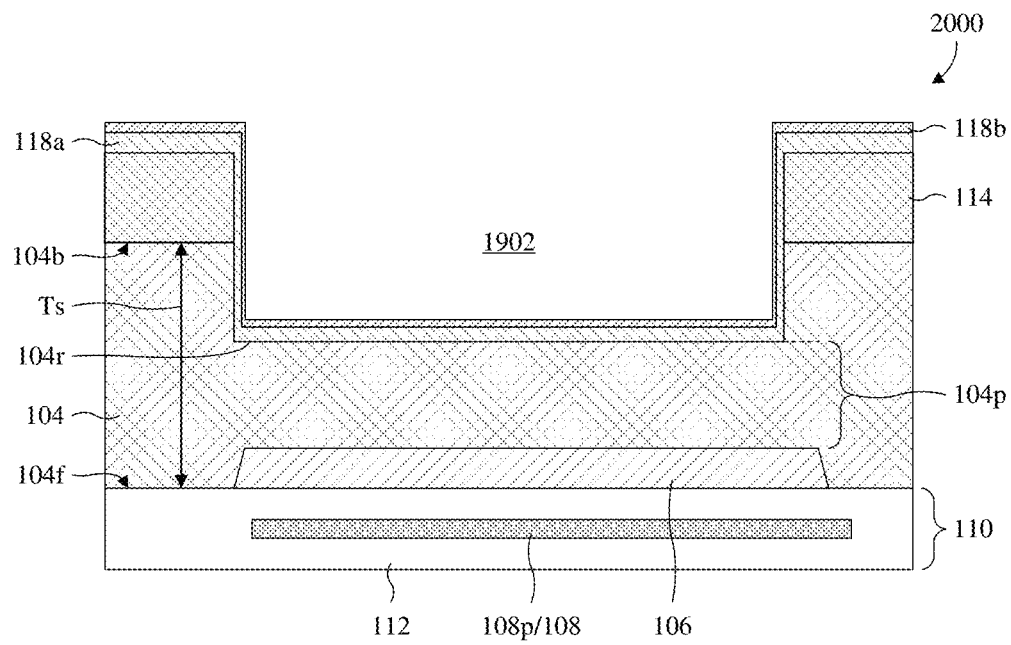

As illustrated by the cross-sectional view 2000 of FIG. 20, a first backside liner layer 118a and a second backside liner layer 118b are deposited covering the backside dielectric layer 114 and lining the first opening 1902. The first and second backside liner layers 118a, 118b are different dielectric materials. For example, the first backside liner layer 118a may be or comprise silicon oxide or some other suitable oxide, whereas the second backside liner layer 118b may be or comprise silicon nitride or other suitable nitride. In alternative embodiments, the first backside liner layer 118a or the second backside liner layer 118b is omitted.

Figure 21:
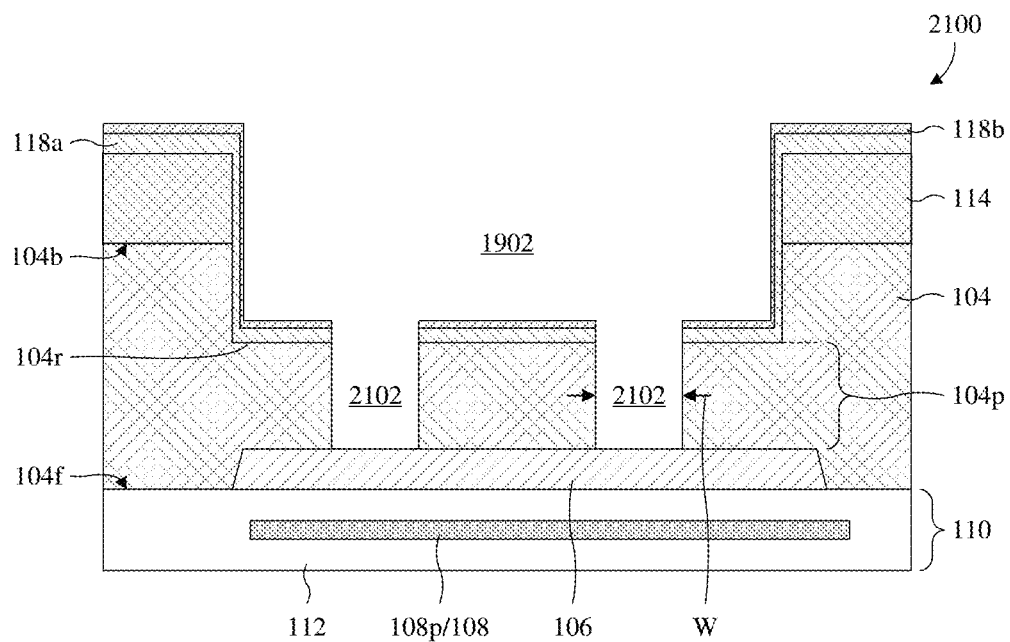

As illustrated by the cross-sectional view 2100 of FIG. 21, a second etch is performed selectively into the backside 104b of the semiconductor substrate 104 to form a pair of second openings 2102. The second etch may, for example, be performed selectively by a photolithography/etching process or by some other suitable process.

The second openings 2102 are at a bottom of the first opening 1902 and have individual widths W less than that of the first opening 1902. Further, the second openings 2102 extend from the first opening 1902, through the pad portion 104p of the semiconductor substrate 104, to the frontside trench isolation structure 106. Hence, the second etch stops on the frontside trench isolation structure 106. In alternative embodiments, the second openings 2102 also extend through the frontside trench isolation structure 106 to the frontside interconnect dielectric layer 112. Hence, the second etch stops on the frontside interconnect dielectric layer 112.

Figure 22:
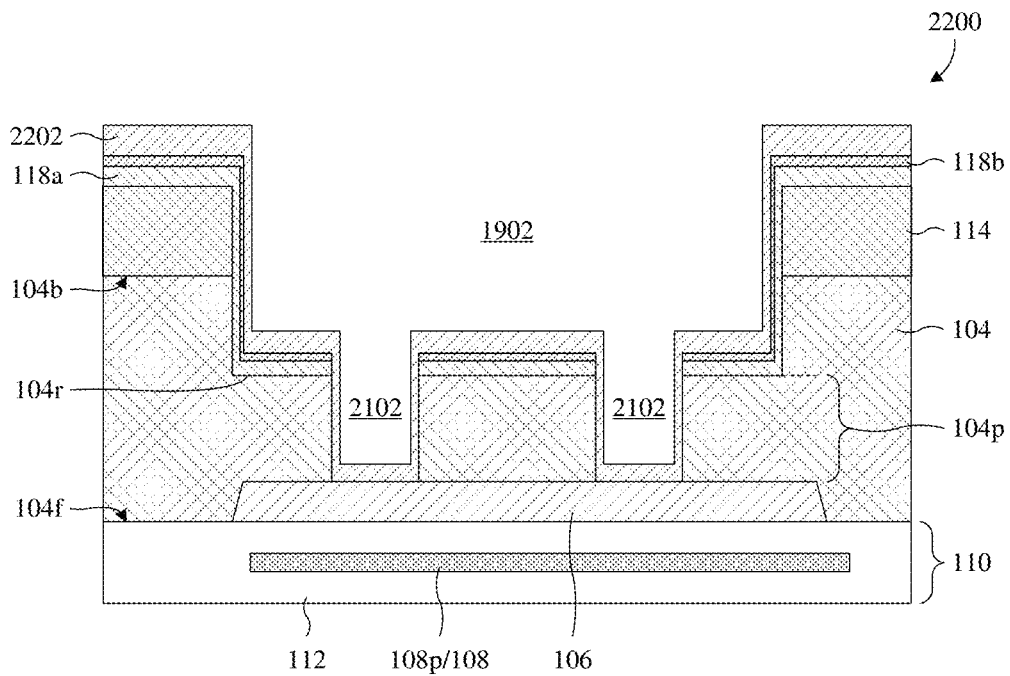

As illustrated by the cross-sectional view 2200 of FIG. 22, a backside spacer layer 2202 is deposited covering the second backside liner layer 118b and further lining the first and second openings 1902, 2102. The backside spacer layer 2202 may, for example, be or comprise silicon oxide, some other suitable oxide and/or dielectric, or any combination of the foregoing.

Figure 23:
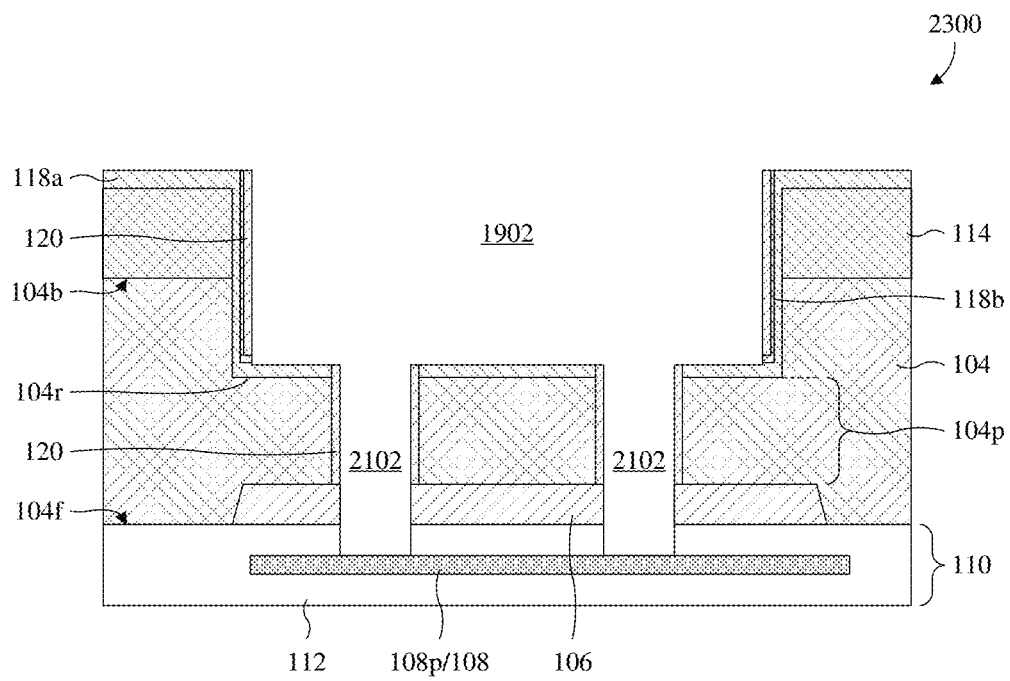

As illustrated by the cross-sectional view 2300 of FIG. 23, a third etch is performed blanketing the backside 104b of the semiconductor substrate 104. The third etch removes horizontally extending portions of the backside spacer layer 2202 (see, e.g., FIG. 22) to form backside spacers 120 from the backside spacer layer 2202. The backside spacers 120 are on sidewalls of the pad portion 104p of the semiconductor substrate 104 and are further on sidewalls of the second backside liner layer 118b. Further, the third etch extends the second openings 2102 to the pad wire 108p and removes horizontally extending portions of the second backside liner layer 118b not covered by the backside spacers 120. In some embodiments, remaining portions of the of the second backside liner layer 118b may also be regarded as backside spacers. In some embodiments, the third etch further reduces a thickness of the first backside liner layer 118a.

Figure 24:
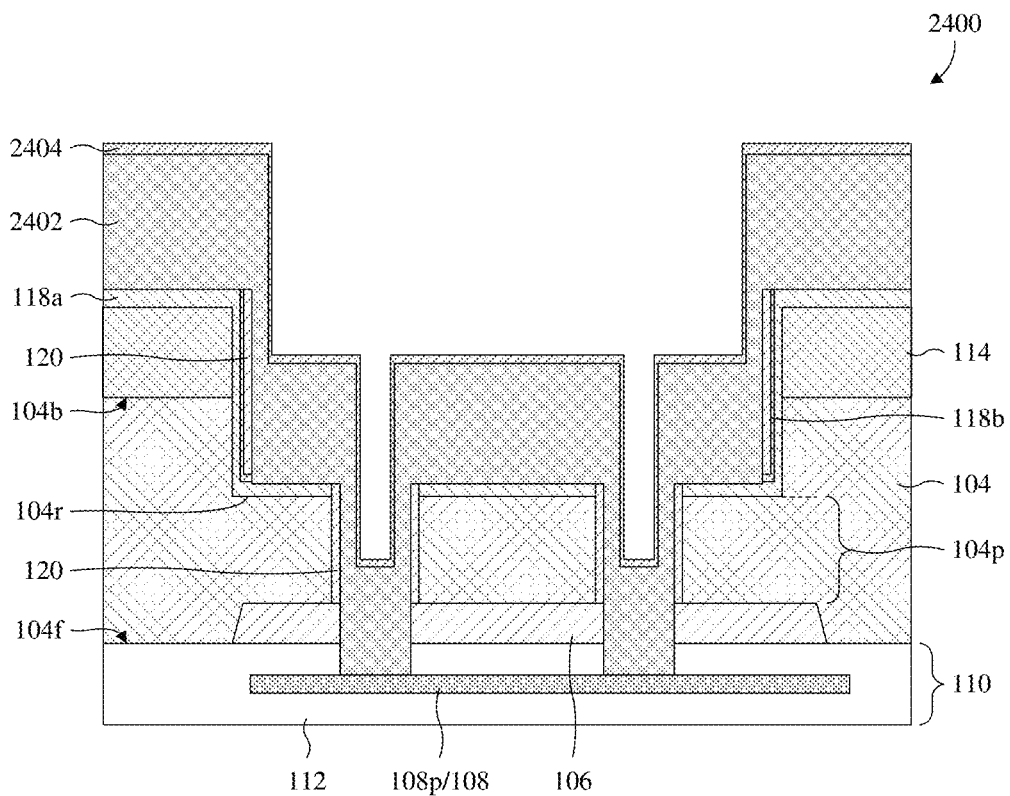

As illustrated by the cross-sectional view 2400 of FIG. 24, a pad layer 2402 and a pad protection layer 2404 are deposited covering the backside 104b of the semiconductor substrate 104 and lining the first and second openings 1902, 2102 (see, e.g., FIG. 23). The pad layer 2402 may, for example, be or comprise aluminum copper, copper, aluminum, some other suitable metal(s) and/or conductive material(s), or any combination of the foregoing. The pad protection layer 2404 overlies the pad layer 2402 and may, for example, be or comprise silicon oxynitride, silicon nitride, some other suitable dielectric(s), or any combination of the foregoing.

Figure 25:
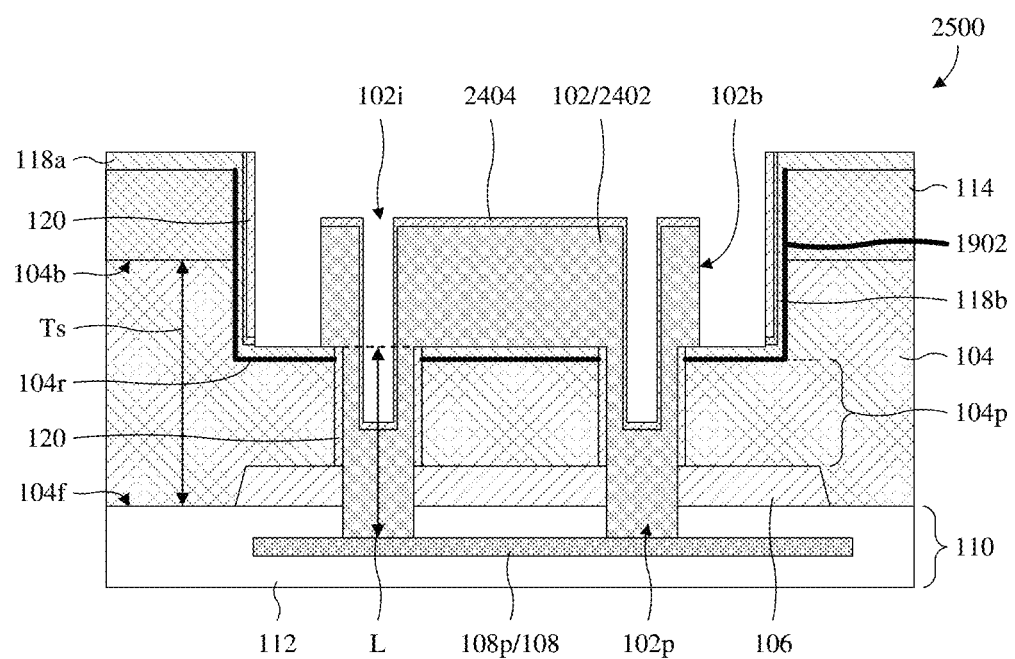

As illustrated by the cross-sectional view 2500 of FIG. 25, a fourth etch is performed selectively into the pad layer 2402 and the pad protection layer 2404. The fourth etch forms a stilted pad structure 102 from the pad layer 2402 and further localizes the pad protection layer 2404 atop the stilted pad structure 102. The fourth etch may, for example, be performed selectively by a photolithography/etching process or by some other suitable patterning process.

The stilted pad structure 102 comprises a pad body 102b and a pair of pad protrusions 102p. The pad body 102b is exposed from the backside 104b of the semiconductor substrate 104 and overlies the pad portion 104p of the semiconductor substrate 104. Further, the pad body 102b is separated from sidewalls of surrounding structure and has a top that is flat, except for indents 102*i* respectively overlying the pad protrusions 102*p*. In alternative embodiments, the indents 102*i* are omitted from the top of the pad body 102*b*. The pad protrusions 102*p* are respectively on opposite sides of the pad body 102*b* and extend from a bottom of the pad body 102*b* to the pad wire 108*p*. By extending to the pad wire 108*p*, the pad protrusions 102*p* electrically couple the pad body 102*b* to the pad wire 108*p*. Further, the pad protrusions 102*p* bond with the frontside interconnect dielectric layer 112, the frontside trench isolation structure 106, and the pad portion 104*p* to secure the stilted pad structure 102 in place.

Because the first opening 1902 (better seen at, for example, FIG. 19) is spaced from the frontside trench isolation structure 106 by the pad portion 104*p* of the semiconductor substrate 104, the pad protrusions 102*p* are formed with a length L that is large. If the pad portion 104*p* was omitted and the first opening 1902 was formed exposing the frontside trench isolation structure 106, for example, the length L would be small. Because the length L is large, the bond area between the pad protrusions 102*p* and surrounding structure is large. The large bond area may, in turn, increase bondability of the stilted pad structure 102 and reduce the likelihood of delamination.

Because the thickness Ts of the semiconductor substrate 104 is traversed by a combination of the first and second etches (see, e.g., FIGS. 19 and 21), the first etch may extend into the backside 104*b* of the semiconductor substrate 104 to a depth independent of the thickness Ts. As a result, the first etch is not subject to costly and timely tuning of parameters for variations in the thickness Ts. Further, a depth to which the pad body 102*b* is inset into the backside 104*b* of the semiconductor substrate 104 may be small and backside topography may have a small degree of variation. Because of the small degree of variation, the process window (e.g., resiliency) for forming other structures on the backside 104*b* is large and a dielectric filler layer may be omitted from unfilled portions of the first opening 1902. Further, to the extent that a dielectric filler layer is formed in unfilled portions of the first opening 1902, the corresponding processing steps do not vary depending on the thickness Ts and are hence not subject to costly and timely tuning of parameters for variations in the thickness Ts.

Hereafter, the cross-sectional views (e.g., the cross-sectional views 2600-2900 of FIGS. 26-29) expand beyond box E to provide a more expansive view of the various processing steps performed after forming the stilted pad structure 102. However, for drawing compactness, the second IC chip 702 described above with regard to FIGS. 16-18 is not shown. Hence, even though the cross-sectional views hereafter described do not show the second IC chip 702, it is to be appreciated that the second IC chip 702 persists out of view.

Figure 26:
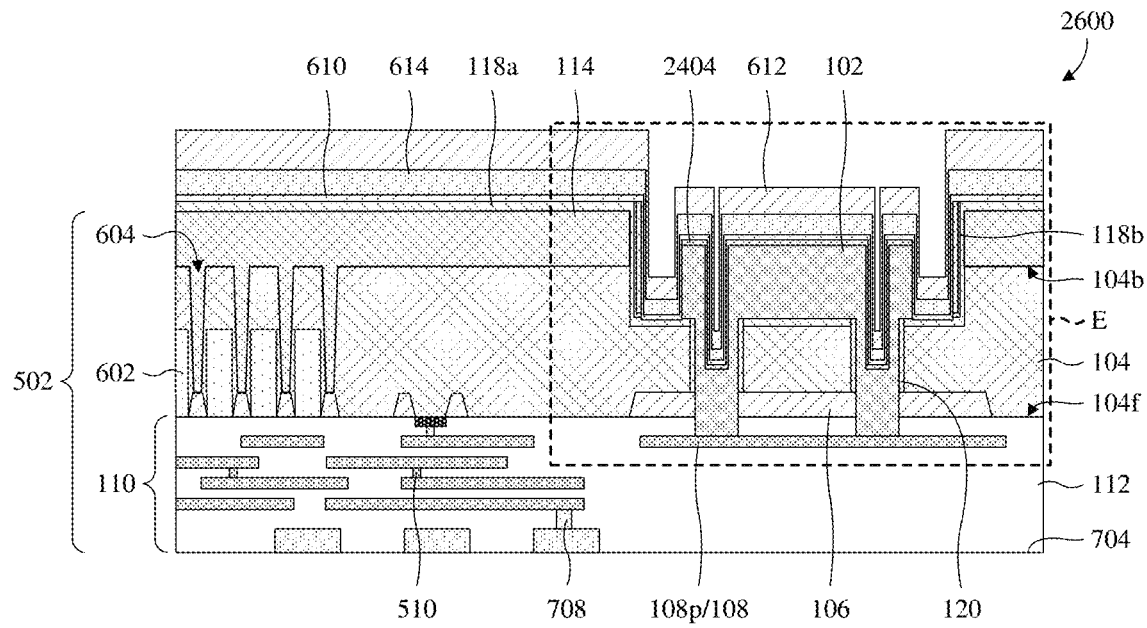

As illustrated by the cross-sectional view 2600 of FIG. 26, a first grid dielectric layer 610, a second grid dielectric layer 612, and a grid metal layer 614 are deposited blanketing the backside 104*b* of the first IC chip 502. The grid metal layer 614 is deposited over the first grid dielectric layer 610, and the second grid dielectric layer 612 is deposited over the grid metal layer 614. The first grid dielectric layer 610 and/or the second grid dielectric layer 612 may, for example, be or comprise silicon oxide, some other suitable oxide and/or dielectric, or any combination of the foregoing. In some embodiments, the first grid dielectric layer 610 has a thickness of about 250 angstroms or some other suitable value. The grid metal layer 614 may, for example, be or comprise tungsten and/or some other suitable metal(s).

Figure 27:
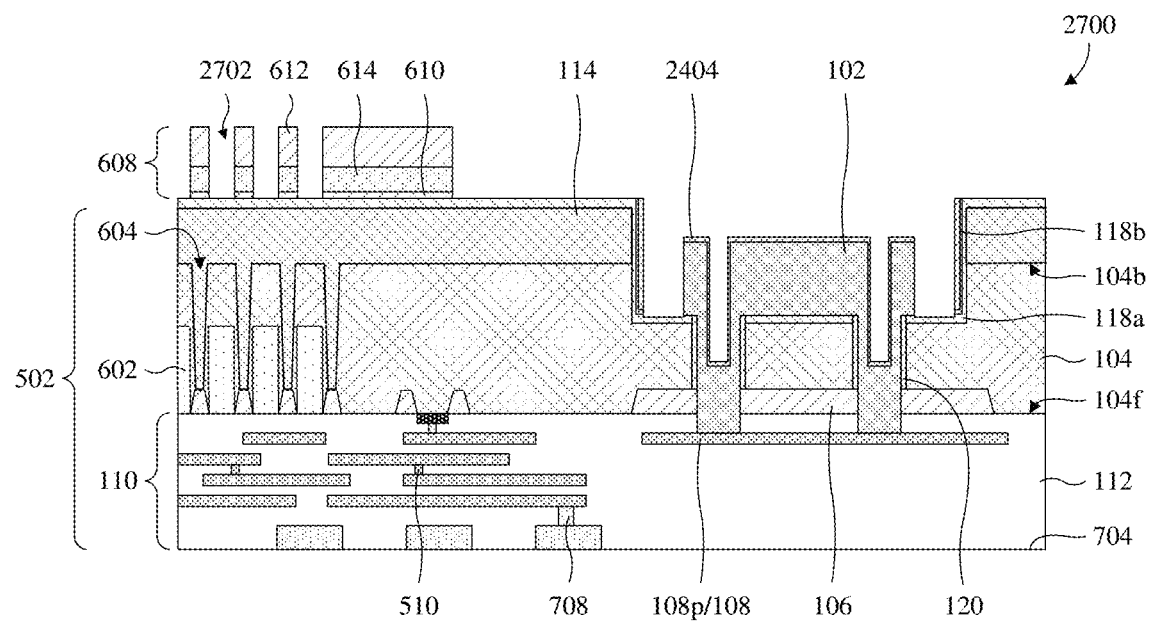

As illustrated by the cross-sectional view 2700 of FIG. 27, the first grid dielectric layer 610, the second grid dielectric layer 612, and the grid metal layer 614 are patterned to form a composite grid 608. The composite grid 608 comprises a plurality of grid openings 2702. The grid openings 2702 are individual to and respectively overlie the photodetectors 602. The patterning may, for example, be performed by a photolithography/etching process or by some other suitable patterning process.

Figure 28:
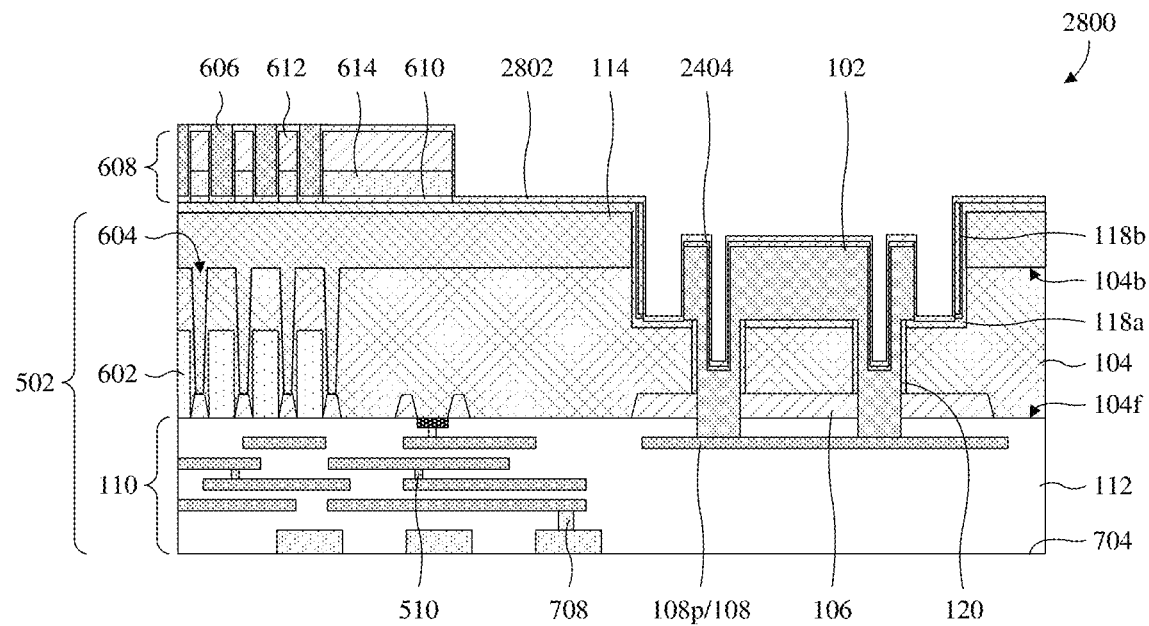

As illustrated by the cross-sectional view 2800 of FIG. 28, a grid liner layer 2802 is deposited blanketing the backside 104*b* of the semiconductor substrate 104 and lining the grid openings 2702 (see, e.g., FIG. 27). Further, a plurality of color filters 606 is formed inset into the composite grid 608. The color filters 606 are individual to and respectively fill the grid openings 2702 over the grid liner layer 2802. The grid liner layer 2802 may, for example, be or comprise silicon oxide, some other suitable oxide and/or dielectric, or any combination of the foregoing.

Figure 29:
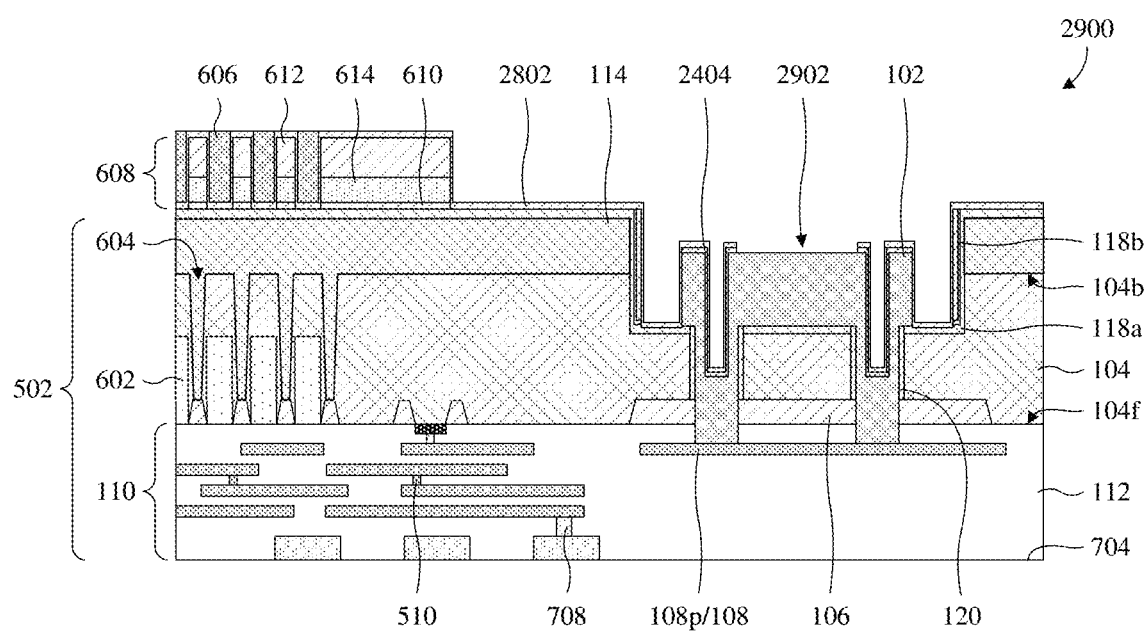

As illustrated by the cross-sectional view 2900 of FIG. 29, the grid liner layer 2802 and the pad protection layer 2404 are patterned to form an opening 2902 overlying and exposing the stilted pad structure 102. The patterning may, for example, be performed by a photolithography/etching process or by some other suitable patterning process.

While FIGS. 15-29 are described with reference to various embodiments of a method, it will be appreciated that the structures shown in FIGS. 15-29 are not limited to the method but rather may stand alone separate of the method. While FIGS. 15-29 are described as a series of acts, it will be appreciated that the order of the acts may be altered in other embodiments. While FIGS. 15-29 illustrate and describe as a specific set of acts, some acts that are illustrated and/or described may be omitted in other embodiments. Further, acts that are not illustrated and/or described may be included in other embodiments.

Figure 30:
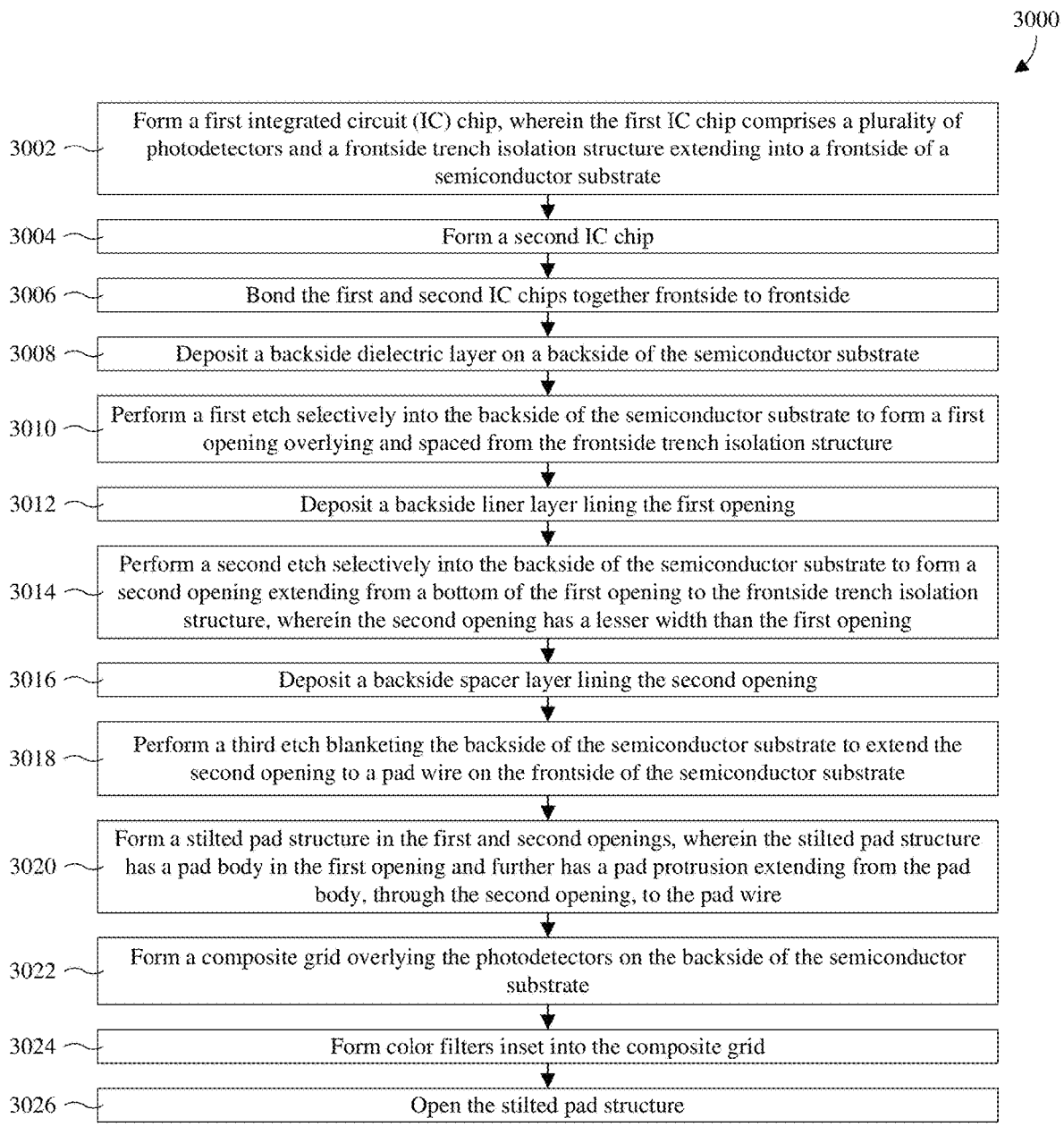
FIG. 30 provides a block diagram of some embodiments of the method of FIGS. 15-29.

With reference to FIG. 30, a block diagram 3000 of some embodiments of the method of FIGS. 15-29 is provided.

At 3002, a first IC chip is formed, wherein the first IC chip comprises a plurality of photodetectors and a frontside trench isolation structure extending into a frontside of a semiconductor substrate. See, for example, FIG. 15.

At 3004, a second IC chip is formed. See, for example, FIG. 16.

At 3006, the first and second IC chips are bonded together frontside to frontside. See, for example, FIG. 17.

At 3008, a backside dielectric layer is deposited on a backside of the semiconductor substrate. See, for example, FIG. 18.

At 3010, a first etch is performed selectively into the backside of the semiconductor substrate to form a first opening overlying and spaced from the frontside trench isolation structure. See, for example, FIG. 19.

At 3012, a backside liner layer is deposited lining the first opening. See, for example, FIG. 20.

At 3014, a second etch is performed selectively into the backside of the semiconductor substrate to form a second opening extending from a bottom of the first opening to the frontside trench isolation structure, wherein the second opening has a lesser width than the first opening. See, for example, FIG. 21.

At 3016, a backside spacer layer is deposited lining the second opening. See, for example, FIG. 22.

At 3018, a third etch is performed blanketing the backside of the semiconductor substrate to extend the second opening to a pad wire on the frontside of the semiconductor substrate. See, for example, FIG. 23.

At 3020, a stilted pad structure is form in the first and second openings, wherein the stilted pad structure has a pad body in the first opening and further has a pad protrusion extending from the pad body, through the second opening, to the pad wire. See, for example, FIGS. 24 and 25.

At 3022, a composite grid is formed overlying the photodetectors on the backside of the semiconductor substrate. See, for example, FIGS. 26 and 27.

At 3024, color filters are formed inset into the composite grid. See, for example, FIG. 28.

At 3026, the stilted pad structure is opened. See, for example, FIG. 29.

While the block diagram 3000 of FIG. 30 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

Figure 31:
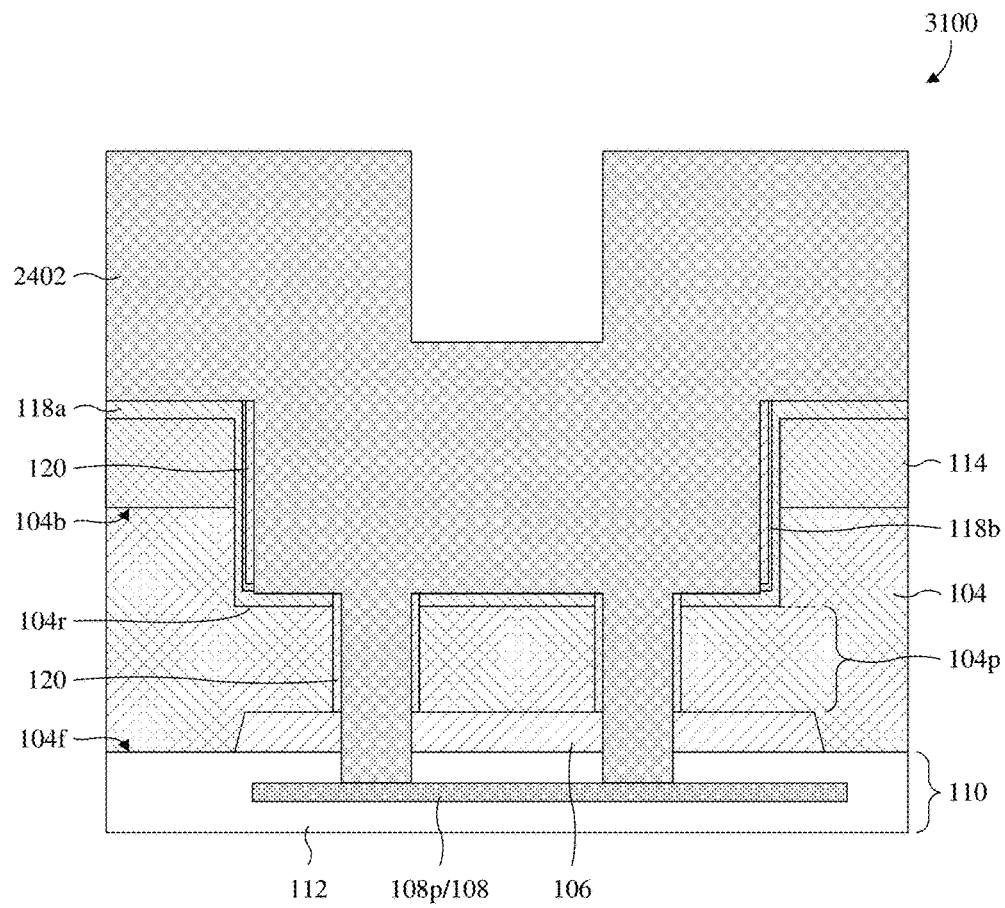
FIGS. 31-33 provide a series of cross-sectional views of some first alternative embodiments of the method of FIGS. 15-29 in which the stilted pad structure fully fills an opening within which the stilted pad structure is formed.
Figure 32:
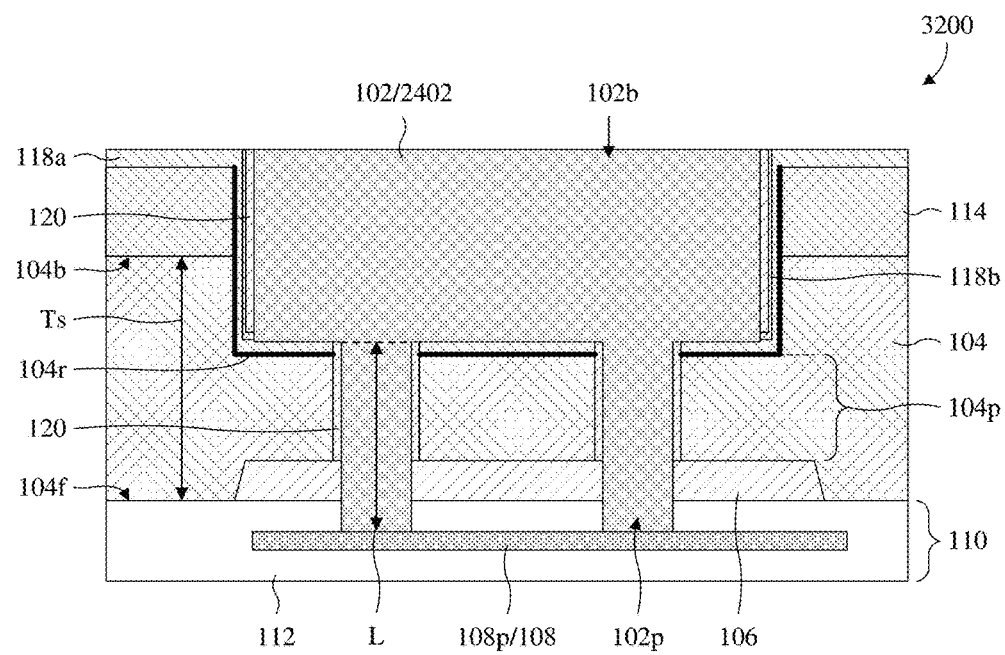
Figure 33:
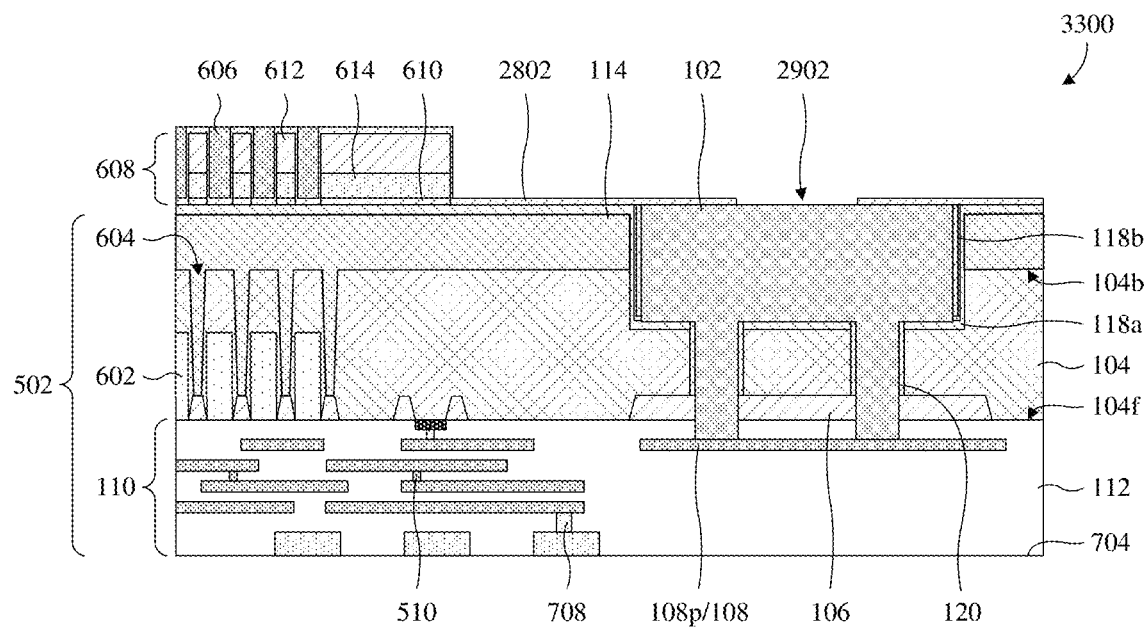
Figure 34:
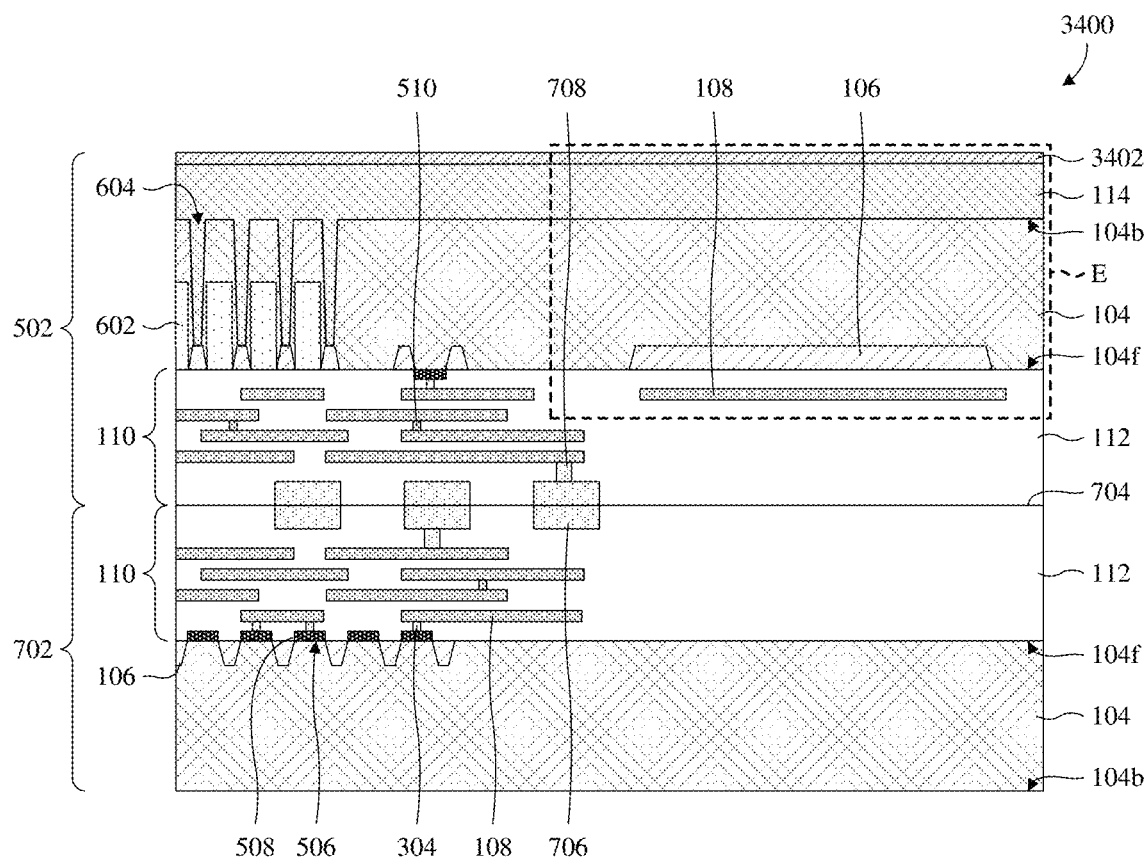
FIGS. 34-39 provide a series of cross-sectional views of some second alternative embodiments of the method of FIGS. 15-29 in which a dielectric filler layer overlies the stilted pad structure and fills unfilled portions of an opening within which the stilted pad structure is formed.

With reference to FIGS. 31-33, a series of cross-sectional views 3100-3300 of some first alternative embodiments of the method of FIGS. 15-29 is provided in which the stilted pad structure 102 fully fills the first and second openings 1902, 2102. The first alternative embodiments may, for example, form the stilted pad structure as in FIG. 3B.

The acts described with regard to FIGS. 15-23 are unchanged in the first alternative embodiments. Therefore, in accordance with the first alternative embodiments, the acts described with regard to FIGS. 15-23 are performed as illustrated and described above. Thereafter, as illustrated by the cross-sectional view 3100 of FIG. 31, the acts described with regard to FIG. 24 are performed, except that the pad layer 2402 is deposited fully filling the first and second openings 1902, 2102 (see, e.g., FIG. 23) and the pad protection layer 2404 is omitted.

As illustrated by the cross-sectional view 3200 of FIG. 32, a planarization is performed into the pad layer 2402. The planarization forms the stilted pad structure 102 from the pad layer 2402 and with a top surface level with that of the first backside liner layer 118a. The planarization may, for example, be performed a CMP or some other suitable planarization. Because the top surface is level with that of the first backside liner layer 118a, backside topography may have a small degree of variation. Because of the small degree of variation, the process window (e.g., resiliency) for forming other structures on the backside is large.

As illustrated by the cross-sectional view 3300 of FIG. 33, the acts described with regard to FIGS. 26-29 are performed as illustrated and described above.

While FIGS. 31-33 are described with reference to various embodiments of a method, it will be appreciated that the structures shown in FIGS. 31-33 are not limited to the method but rather may stand alone separate of the method. While FIGS. 31-33 are described as a series of acts, it will be appreciated that the order of the acts may be altered in other embodiments. While FIGS. 31-33 illustrate and describe as a specific set of acts, some acts that are illustrated and/or described may be omitted in other embodiments. Further, acts that are not illustrated and/or described may be included in other embodiments.

With reference to FIGS. 34-39, a series of cross-sectional views 3400-3900 of some second alternative embodiments of the method of FIGS. 15-29 is provided in which a dielectric filler layer overlies the stilted pad structure 102 and fills unfilled portions of the first and second openings 1902, 2102. The second alternative embodiments may, for example, form the stilted pad structure as in FIG. 3A.

The acts described with regard to FIGS. 15-18 are unchanged in the second alternative embodiments. Therefore, in accordance with the second alternative embodiments, the acts described with regard to FIGS. 15-18 are performed as illustrated and described above. Thereafter, as illustrated by the cross-sectional view 3400 of FIG. 34, a second backside dielectric layer 3402 is deposited covering the backside dielectric layer 114. The second backside dielectric layer 3402 is a different material type than the backside dielectric layer 114 and may, for example, be or comprise silicon nitride and/or some other suitable dielectric(s).

Figure 35:
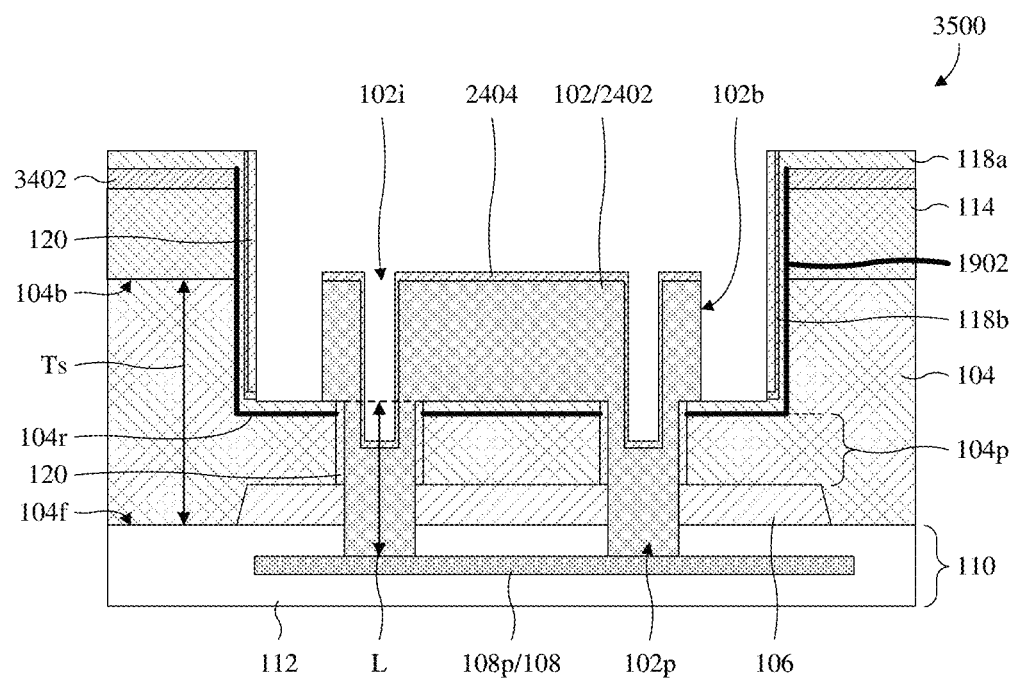

As illustrated by the cross-sectional view 3500 of FIG. 35, the acts described with regard to FIGS. 19-25 are performed as illustrated and described above.

Figure 36:
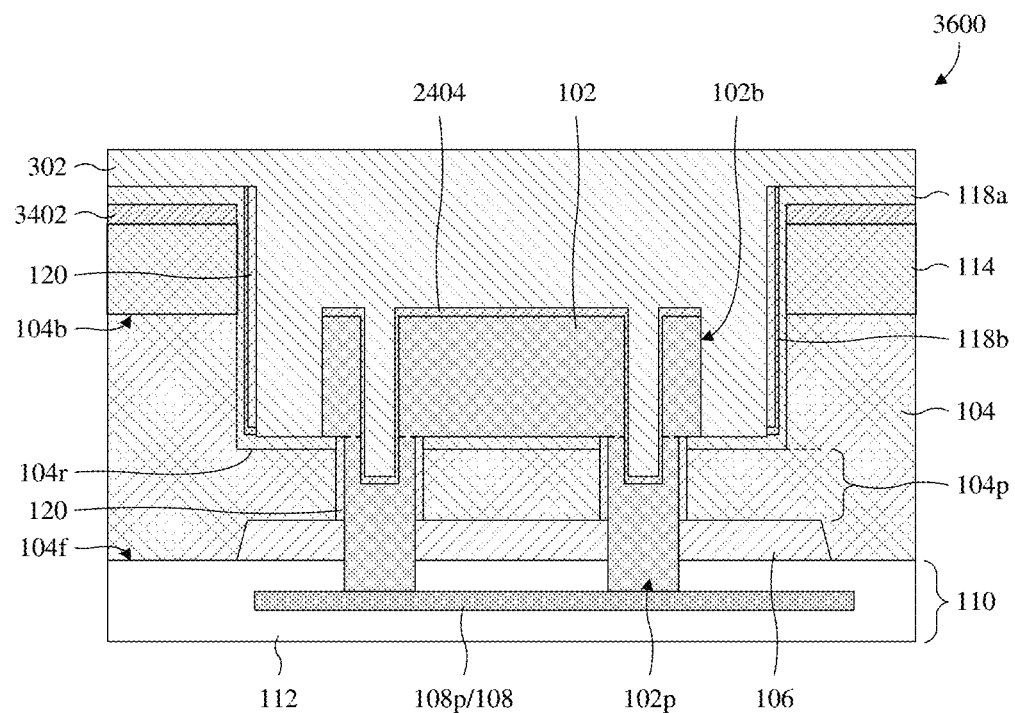

As illustrated by the cross-sectional view 3600 of FIG. 36, a dielectric filler layer 302 is deposited covering the first backside liner layer 118a and filling the first and second openings 1902, 2102 (see, e.g., FIG. 23) over the stilted pad structure 102. Further, a planarization is performed into the dielectric filler layer 302 to flatten a top surface of the dielectric filler layer 302. The dielectric filler layer 302 may, for example, be or comprise silicon oxide, some other suitable oxide and/or dielectric, or any combination of the foregoing. The planarization may, for example, be performed by a CMP or some other suitable planarization. In some embodiments, a thickness of the dielectric filler layer 302 is about 2000 angstroms or some other suitable value outside the first opening 1902 (see, e.g., FIG. 23).

Figure 37:
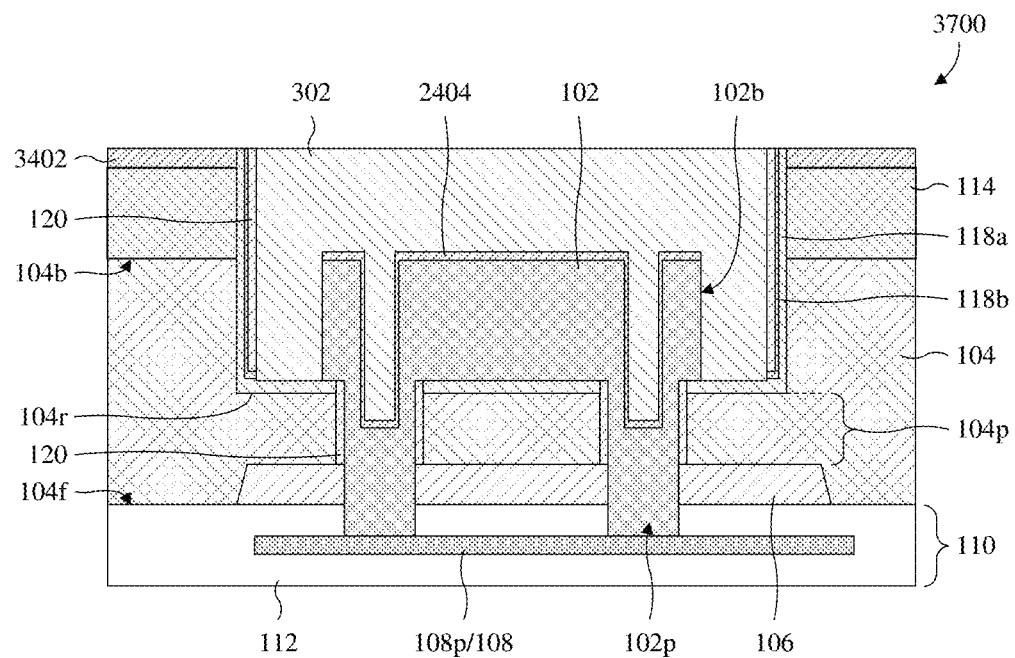

As illustrated by the cross-sectional view 3700 of FIG. 37, a first etch back is performed into the dielectric filler layer 302 and the first backside liner layer 118a. The first etch back recesses the top surface of the dielectric filler layer 302 to even with, or about even with, a top surface of the second backside dielectric layer 3402. Further, the first etch back removes portions the first backside liner layer 118a atop the second backside dielectric layer 3402. In some embodiments, the first etch back thins the second backside dielectric layer 3402. The first etch back may, for example, be performed by wet etching or by some other suitable type of etching.

Figure 38:
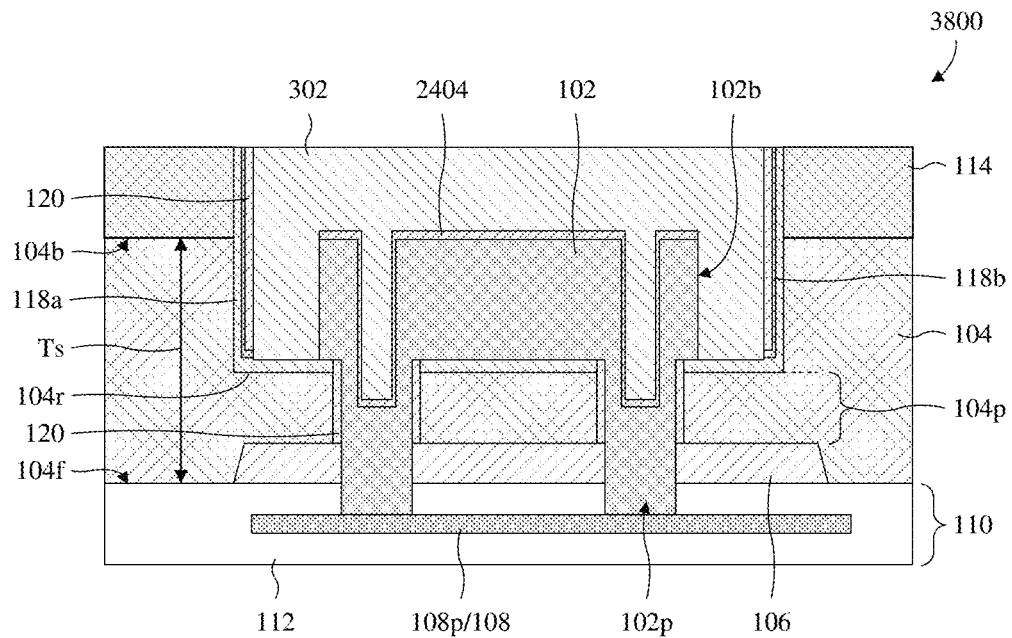

As illustrated by the cross-sectional view 3800 of FIG. 38, a second etch back is performed into the dielectric filler layer 302 and the second backside dielectric layer 3402. The second etch back recesses the top surface of the dielectric filler layer 302 to even with, or about even with, a top surface of the backside dielectric layer 114. Further, the second etch back removes the second backside dielectric layer 3402. In some embodiments, the second etch back thins the backside dielectric layer 114. The second etch back may, for example, be performed by dry etching or by some other suitable type of etching.

Because the thickness Ts of the semiconductor substrate 104 is traversed by a combination of the first and second etches (see, e.g., FIGS. 19 and 21), the first etch may extend into the backside 104b of the semiconductor substrate 104 to a depth independent of the thickness Ts. As a result, a depth to which the pad body 102b is inset into the backside 104b of the semiconductor substrate 104, and hence a thickness of the dielectric filler layer 302, may be independent of the thickness Ts of the semiconductor substrate 104. Because the thickness of the dielectric filler layer 302 may be independent of the thickness Ts of the semiconductor substrate 104, the corresponding processing steps (see, e.g., FIGS. 36-38) for forming the dielectric filler layer 302 do not depend on the thickness Ts and are hence not subject to costly and timely tuning of parameters for variations in the thickness Ts.

Figure 39:
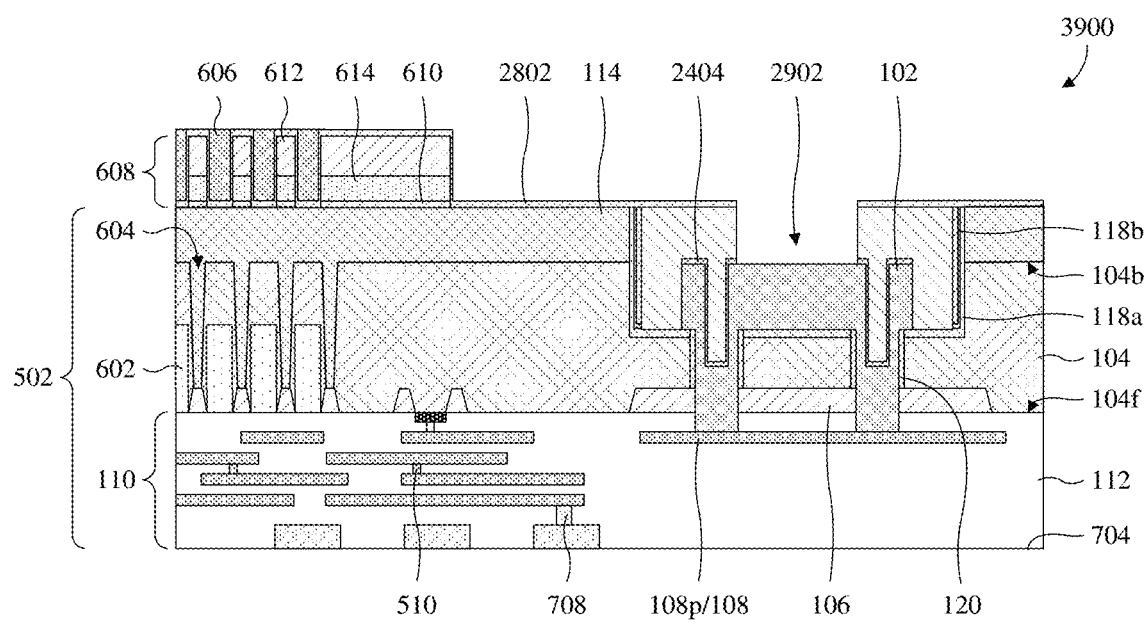

As illustrated by the cross-sectional view 3900 of FIG. 39, the acts described with regard to FIGS. 26-29 are performed as illustrated and described above.

While FIGS. 34-39 are described with reference to various embodiments of a method, it will be appreciated that the structures shown in FIGS. 34-39 are not limited to the method but rather may stand alone separate of the method. While FIGS. 34-39 are described as a series of acts, it will be appreciated that the order of the acts may be altered in other embodiments. While FIGS. 34-39 illustrate and describe as a specific set of acts, some acts that are illustrated and/or described may be omitted in other embodiments. Further, acts that are not illustrated and/or described may be included in other embodiments.

In some embodiments, the present disclosure provides an IC chip including: a semiconductor substrate; a wire underlying the semiconductor substrate on a frontside of the semiconductor substrate; and a pad structure inset into a backside of the semiconductor substrate that is opposite the frontside, wherein the pad structure includes a pad body and a first pad protrusion, and wherein the first pad protrusion underlies the pad body and protrudes through a portion of the semiconductor substrate towards the wire from the pad body; wherein the pad body overlies the portion of the semiconductor substrate. In some embodiments, the first pad protrusion extends to direct contact with the wire. In some embodiments, the IC chip further includes a plurality of wires grouped into a plurality of wire levels, wherein the wire levels correspond to different elevations, wherein the plurality of wire levels includes a first wire level and a second wire level, wherein the second wire level is separated from the semiconductor substrate by the first wire level and includes the wire. In some embodiments, the IC chip further includes: a trench isolation structure extending into the frontside of the semiconductor substrate; and a contact having a columnar profile, wherein the contact extends from the first pad protrusion to the wire and separates the first pad protrusion from the wire, and wherein the contact and the first pad protrusion directly contact at the trench isolation structure. In some embodiments, the pad structure is exposed from the backside of the semiconductor substrate. In some embodiments, the IC chip further includes a dielectric filler layer overlying the pad structure, and covering a sidewall of the pad structure, on the backside of the semiconductor substrate, wherein the dielectric filler layer defines a pad opening overlying and exposing the pad body. In some embodiments, a sidewall of the pad structure is exposed to an ambient environment of the IC chip. In some embodiments, the IC chip further includes a dielectric film on the backside of the semiconductor substrate and having a first segment and a second segment, wherein the first and second segments extend along individual sidewalls of the semiconductor substrate, and wrap around individual bottom corners of the pad structure, respectively on opposite sides of the pad structure, wherein a top surface of the pad structure is level with a top surface of the dielectric film, and wherein the top surface of the pad structure is flat and extends continuously from the first segment to the second segment. In some embodiments, the pad structure further includes a second protrusion that is separated from the first pad protrusion by the portion of the semiconductor substrate, wherein the second protrusion protrudes through the portion of the semiconductor substrate towards the wire from the pad body.

In some embodiments, the present disclosure provides an IC package including a first IC chip, wherein the first IC chip includes: a first semiconductor substrate; a trench isolation structure extending into a frontside of the first semiconductor substrate; a first interconnect structure underlying the first semiconductor substrate on the frontside of the first semiconductor substrate; and a pad structure inset into a backside of the first semiconductor substrate that is opposite the frontside, wherein the pad structure includes a first pad protrusion protruding through the trench isolation structure towards the first interconnect structure; wherein the first pad protrusion extends along a sidewall of the first semiconductor substrate that overlies the trench isolation structure and that underlies the pad structure. In some embodiments, the IC package further includes a dielectric spacer extending along the sidewall of the first semiconductor substrate, from top to bottom, and extending from the sidewall to the first pad protrusion. In some embodiments, the pad structure includes a second pad protrusion protruding through the trench isolation structure towards the first interconnect structure, wherein the sidewall of the first semiconductor substrate is between the first and second pad protrusions. In some embodiments, the IC package further includes a wire bond structure directly contacting the pad structure on the backside of the first semiconductor substrate. In some embodiments, the IC package further includes a second IC chip bonded to, and on the frontside of the first semiconductor substrate, wherein the second IC chip includes a second semiconductor substrate and a second interconnect structure, wherein the second interconnect structure includes a plurality of wires and a plurality of vias, wherein the wires and the vias are alternatingly stacked, and wherein first pad protrusion protrudes to a first wire in the second interconnect structure. In some embodiments, the first pad protrusion protrudes to a first via in the first interconnect structure, wherein the first via separates the first pad protrusion from a first wire in the first interconnect structure and extends from the first pad protrusion to the first wire.

In some embodiments, the present disclosure provides a method for forming a pad structure, the method including: forming a trench isolation structure extending into a frontside of a semiconductor substrate; performing a first etch selectively into the semiconductor substrate from a backside of the semiconductor substrate opposite the frontside to form a first opening, wherein the semiconductor substrate has a recessed surface in the first opening at completion of the first etch, and wherein the recessed surface extends laterally along a bottom of the first opening from a first side of the first opening to a second side of the first opening opposite the first side; performing a second etch selectively into the recessed surface to form a second opening with a lesser width than the first opening and extending to the trench isolation structure; and forming a pad structure in the first and second openings and protruding to a conductive feature on the frontside of the semiconductor substrate through the second opening. In some embodiments, the method further includes: depositing dielectric spacer layer lining the first and second openings and spaced from the conductive feature; and performing a third etch to extend the second opening to the conductive feature, wherein the third etch is a blanket etch performed with the dielectric spacer layer in place. In some embodiments, the method further includes: depositing a conductive layer fully filling the first and second openings and covering a backside surface of the semiconductor substrate elevated relative to the recessed surface; and performing a planarization into a conductive layer to remove the conductive layer from the backside surface, wherein the planarization forms the pad structure from the conductive layer. In some embodiments, the method further includes: depositing a conductive layer lining the first and second openings; and performing a third etch selectively into the conductive layer to form the pad structure from the conductive layer, wherein the pad structure has a sidewall facing a neighboring sidewall of the semiconductor substrate and separated from the neighboring sidewall by an unfilled portion of the first opening. In some embodiments, the method further includes: depositing a dielectric filler layer covering the pad structure and filling the unfilled portion of the first opening; and performing a fourth etch selectively into the dielectric filler layer to form a third opening exposing the pad structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a pad structure, the method comprising:
    forming a trench isolation structure extending into a frontside of a semiconductor substrate;
    performing a first etch selectively into the semiconductor substrate from a backside of the semiconductor substrate opposite the frontside of the semiconductor substrate to form a first opening, wherein the semiconductor substrate has a recessed surface in the first opening at completion of the first etch, and wherein the recessed surface extends laterally along a bottom of the first opening from a first side of the first opening to a second side of the first opening opposite the first side of the first opening;
    performing a second etch selectively into the recessed surface to form a second opening with a lesser width than the first opening and extending to the trench isolation structure; and
    forming a pad structure in the first and second openings and protruding to a conductive feature on the frontside of the semiconductor substrate through the second opening.

2. The method according to claim 1, further comprising:
    depositing a dielectric spacer layer lining the first and second openings and spaced from the conductive feature; and
    performing a third etch to extend the second opening to the conductive feature, wherein the third etch is a blanket etch performed with the dielectric spacer layer in place.

3. The method according to claim 1, further comprising:
    depositing a conductive layer fully filling the first and second openings and covering a backside surface of the semiconductor substrate elevated relative to the recessed surface; and
    performing a planarization into the conductive layer to remove the conductive layer from the backside surface of the semiconductor substrate, wherein the planarization forms the pad structure from the conductive layer.

4. The method according to claim 1, further comprising:
    depositing a conductive layer lining the first and second openings; and
    performing a third etch selectively into the conductive layer to form the pad structure from the conductive layer, wherein the pad structure has a sidewall facing a neighboring sidewall of the semiconductor substrate and separated from the neighboring sidewall of the semiconductor substrate by an unfilled portion of the first opening.

5. The method according to claim 4, further comprising:
    depositing a dielectric filler layer covering the pad structure and filling the unfilled portion of the first opening; and
    performing a fourth etch selectively into the dielectric filler layer to form a third opening exposing the pad structure.

6. The method according to claim 1, wherein the conductive feature is a first wire, and wherein the first wire is level with a second wire that is electrically coupled to a semiconductor device in the semiconductor substrate by a via extending from the second wire to the semiconductor device.

7. The method according to claim 1, further comprising:
    forming an interconnect structure on the frontside of the semiconductor substrate; and
    bonding an integrated circuit (IC) chip to the semiconductor substrate through the interconnect structure, wherein the first etch is performed after the bonding.

8. A method, comprising:
    forming a conductive feature on a frontside of a semiconductor substrate;
    performing a first etch into the semiconductor substrate, from a backside of the semiconductor substrate opposite the frontside of the semiconductor substrate, to form a first opening, wherein the first opening is vertically separated from the conductive feature by a portion of the semiconductor substrate at completion of the first etch;
    performing a second etch into the portion of the semiconductor substrate to form a second opening extending entirely through the portion of the semiconductor substrate, from the first opening, wherein the semiconductor substrate has a sidewall in the second opening at completion of the second etch, and wherein a front edge of the sidewall is elevated relative to a front surface of the semiconductor substrate, which is on the frontside of the semiconductor substrate;
    performing a third etch to extend the second opening to the conductive feature after the second etch; and
    forming a pad body and a pad protrusion respectively in the first opening and the second opening, wherein the pad protrusion protrudes from the pad body to the conductive feature.

9. The method according to claim 8, further comprising:
    forming a third opening extending through the portion of the semiconductor substrate, from the first opening to the conductive feature, concurrently while forming of the second opening; and forming an additional pad protrusion in the third opening and protruding from the pad body to the conductive feature.

10. The method according to claim 9, wherein the third opening and the second opening are respectively on opposite sides of the first opening and have line-shaped top geometries.

11. The method according to claim 8, further comprising:
depositing a conductive layer lining the first and second openings, wherein the conductive layer lining the second opening forms the pad protrusion; and
performing a fourth etch into the conductive layer to form the pad body.

12. The method according to claim 8, further comprising:
forming wires and vias on the frontside of the semiconductor substrate, wherein the wires are grouped into a plurality of wire levels, wherein the vias are grouped into a plurality of via levels alternatingly stacked with the plurality of wire levels, and wherein the conductive feature is in a wire level amongst the plurality of wire levels that is closest to the semiconductor substrate.

13. The method according to claim 8, further comprising:
depositing a sidewall spacer layer lining individual sidewalls of the semiconductor substrate in the first and second openings, wherein the individual sidewalls of the semiconductor substrate include the sidewall of the semiconductor substrate in the second opening; and
performing an etch into the sidewall spacer layer to etch back the sidewall spacer layer and to form a sidewall spacer on the sidewall of the semiconductor substrate, wherein the third etch is performed with the sidewall spacer in place.

14. The method according to claim 8, further comprising:
forming a trench isolation structure extending into the frontside of the semiconductor substrate, wherein the second opening overlies and exposes a top-surface of the trench isolation structure at completion of the second etch.

15. A method, comprising:
forming a trench isolation structure in a substrate;
performing a first patterning process to form a first opening in the substrate, wherein the first opening overlies and is spaced from the trench isolation structure at completion of the first patterning process;
performing a second patterning process to form a second opening extending through the trench isolation structure, from the first opening to an interconnect structure;
depositing a conductive layer in the first opening and the second opening; and
performing a third patterning process to pattern the conductive layer into a conductive pad;
wherein the substrate comprises a semiconductor layer, and wherein the first patterning process patterns the semiconductor layer to form the first opening extending into the semiconductor layer.

16. The method according to claim 15, wherein the conductive pad directly and laterally contacts a sidewall of the trench isolation structure.

17. The method according to claim 15, wherein the second patterning process comprises:
etching the substrate to form the second opening extending from the first opening to a surface of the trench isolation structure, wherein the etching stops at the surface of the trench isolation structure;
forming a dielectric liner on sidewalls of the substrate in the second opening after the etching; and
extending the second opening to the interconnect structure after the forming of the dielectric liner.

18. The method according to claim 15, wherein a portion of the substrate and the trench isolation structure underlie the conductive pad and overlie the interconnect structure.

19. The method according to claim 15, further comprising:
depositing a dielectric filler layer covering the conductive pad and completely filling unfilled portions of the first opening, wherein the dielectric filler layer extends along outermost sidewalls of the conductive pad in the first opening.

20. The method according to claim 15, wherein the semiconductor layer has a surface at a bottom of the first opening, which overlies and is spaced from the trench isolation structure after the first patterning process, and wherein the trench isolation structure extends into the semiconductor layer.

* * * * *